(12) United States Patent
Uchida et al.

(10) Patent No.: US 10,290,994 B2
(45) Date of Patent: May 14, 2019

(54) LASER DEVICE, INFORMATION ACQUISITION DEVICE, AND IMAGING SYSTEM

(71) Applicant: CANON KABUSHIKI KAISHA, Tokyo (JP)

(72) Inventors: Tatsuro Uchida, Machida (JP); Mamoru Uchida, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/332,934

(22) Filed: Oct. 24, 2016

(65) Prior Publication Data
US 2017/0125975 A1    May 4, 2017

(30) Foreign Application Priority Data

Oct. 30, 2015 (JP) .................. 2015-215215
Nov. 18, 2015 (JP) .................. 2015-225810

(51) Int. Cl.
*H01S 5/04* (2006.01)
*H01S 5/10* (2006.01)
(Continued)

(52) U.S. Cl.
CPC .......... *H01S 5/041* (2013.01); *G01B 9/02002* (2013.01); *G01B 9/02004* (2013.01); *G01B 9/02091* (2013.01); *H01S 5/026* (2013.01); *H01S 5/1096* (2013.01); *H01S 5/18366* (2013.01); *H01S 5/34* (2013.01);
(Continued)

(58) Field of Classification Search
CPC .......... H01S 5/041; H01S 5/06–5/0687; H01S 5/1092–5/1096; H01S 5/34–5/347; H01S 5/4087; H01S 5/42–5/423
See application file for complete search history.

(56) References Cited

U.S. PATENT DOCUMENTS

| 4,982,408 A | * | 1/1991 | Shimizu | ................. B82Y 20/00 372/23 |
| 5,513,204 A | * | 4/1996 | Jayaraman | ............. B82Y 20/00 372/50.1 |

(Continued)

FOREIGN PATENT DOCUMENTS

JP    2014-082485 A    5/2014

OTHER PUBLICATIONS

D. Vakhshoori, et al., "2mW CW singlemode operation of a tunable 1550 nm vertical cavity surface emitting laser with 50 nm tuning range", Electronics Letters, May 27, 1999, vol. 35, No. 11, pp. 900-901.

*Primary Examiner* — Xinning(Tom) Niu
*Assistant Examiner* — Sean P Hagan
(74) *Attorney, Agent, or Firm* — Canon U.S.A., Inc. IP Division

(57) ABSTRACT

One or more laser devices, one or more information acquisition devices, one or more imaging systems, and one or more methods for use with same are provided. Embodiments of wavelength-tunable type surface emitting lasers including an active layer and excitation units and for exciting the surface emitting laser are included, and the excitation units excite the active layer of the surface emitting laser so that a carrier occupation state of an energy level that can oscillate different wavelength in different areas of the active layer of the surface emitting laser in the XY in-plane direction is obtained.

18 Claims, 11 Drawing Sheets

(51) Int. Cl.

| | |
|---|---|
| *H01S 5/34* | (2006.01) |
| *H01S 5/40* | (2006.01) |
| *H01S 5/026* | (2006.01) |
| *H01S 5/183* | (2006.01) |
| *H01S 5/343* | (2006.01) |
| *G01B 9/02* | (2006.01) |
| *H01S 3/094* | (2006.01) |

(52) U.S. Cl.
CPC ........ *H01S 5/3408* (2013.01); *H01S 3/09408* (2013.01); *H01S 5/34313* (2013.01); *H01S 5/4062* (2013.01)

(56) References Cited

U.S. PATENT DOCUMENTS

| | | | |
|---|---|---|---|
| 7,266,279 B1* | 9/2007 | Yap | B82Y 20/00 |
| | | | 372/43.01 |
| 8,059,690 B2 | 11/2011 | Chang-Hasnain et al. | |
| 8,189,643 B2 | 5/2012 | Chang-Hasnain et al. | |
| 8,811,442 B2* | 8/2014 | Schulz | B82Y 20/00 |
| | | | 372/43.01 |
| 2004/0141538 A1* | 7/2004 | Schmid | H01S 5/026 |
| | | | 372/70 |
| 2007/0242719 A1* | 10/2007 | Spoonhower | G02B 21/32 |
| | | | 372/50.124 |
| 2011/0228805 A1* | 9/2011 | Trankle | H01S 5/026 |
| | | | 372/50.11 |

\* cited by examiner

LASER DEVICE, INFORMATION ACQUISITION DEVICE, AND IMAGING SYSTEM

BACKGROUND OF THE INVENTION

Field of the Invention

The present disclosure relates to a laser device, an information acquisition device, and an imaging system.

Description of the Related Art

Wavelength-tunable lasers that can change oscillation wavelength have been widely researched and developed in these days since it is expected that they can be applied to various fields such as communication, sensing, and imaging. As a wavelength-tunable laser, so-called MEMS-VCSEL is known that controls oscillation wavelength of a vertical cavity surface emitting laser (hereinafter referred to as "VCSEL") by Micro Electro Mechanical Systems (hereinafter referred to as "MEMS") technique. Specifically, in an MEMS-VCSEL, one of a pair of reflectors is mechanically moved to change cavity length and change laser oscillation wavelength. D. Vakhschoori and six others "2 mW CW singlemode operation of a tunable 1550 nm vertical cavity surface emitting laser with 50 nm tuning range." ELECTRONICS LETTERS. 27 May 1999, Vol. 35, No. 11, p. 900-901 discloses an MEMS-VCSEL that excites an active layer with an external light source.

SUMMARY OF THE INVENTION

In consideration of various applications of a wavelength-tunable laser, a wavelength-tunable laser with wide wavelength-tunable band is desired, and at least one feature of one or more embodiments of the present disclosure is to provide a surface emitting laser with wide wavelength-tunable band.

A laser device according to the present disclosure includes a wavelength-tunable type surface emitting laser including an active layer and an excitation unit for exciting the active layer of the surface emitting laser. The excitation unit excites the active layer of the surface emitting laser so that a carrier occupation state of an energy level can oscillate different wavelength in different areas of the active layer of the surface emitting laser in the in-plane direction intersecting with the light output direction of the surface emitting laser. A laser device according to another aspect of the present disclosure includes a wavelength-tunable type surface emitting laser including an active layer and an excitation unit for exciting the surface emitting laser. The excitation unit excites the active layer of the surface emitting laser so as to change a carrier occupation state of an energy level of the active layer of the surface emitting laser in accordance with oscillation wavelength of the surface emitting laser.

According to other aspects of the present disclosure, one or more additional laser devices, one or more information acquisition devices, one or more imaging systems, and one or more methods for use with same are discussed herein. Further features of the present disclosure will become apparent from the following description of exemplary embodiments (with reference to the attached drawings).

DESCRIPTION OF THE EMBODIMENTS

Figure 1A:
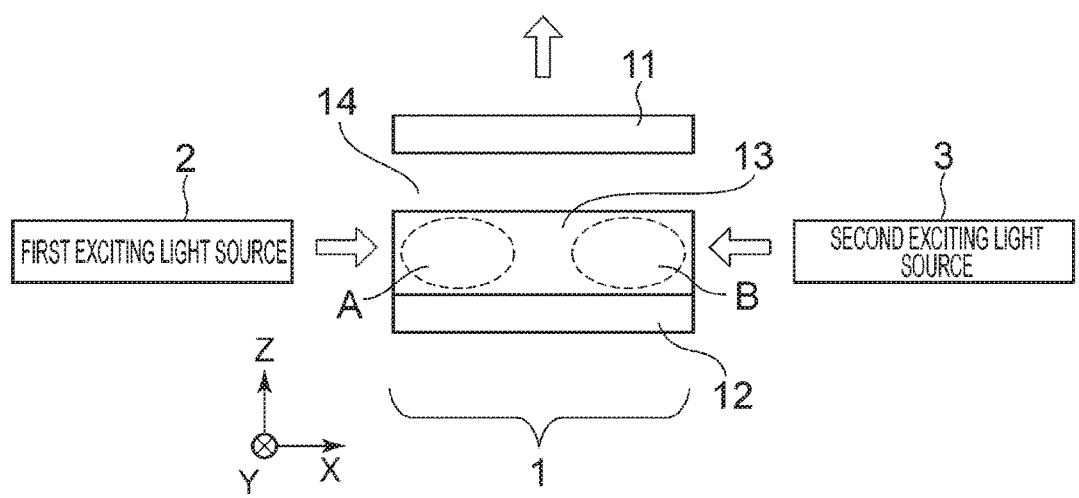
FIGS. 1A and 1B illustrate an outline of a laser device according to at least one embodiment of the present disclosure.
Figure 1B:
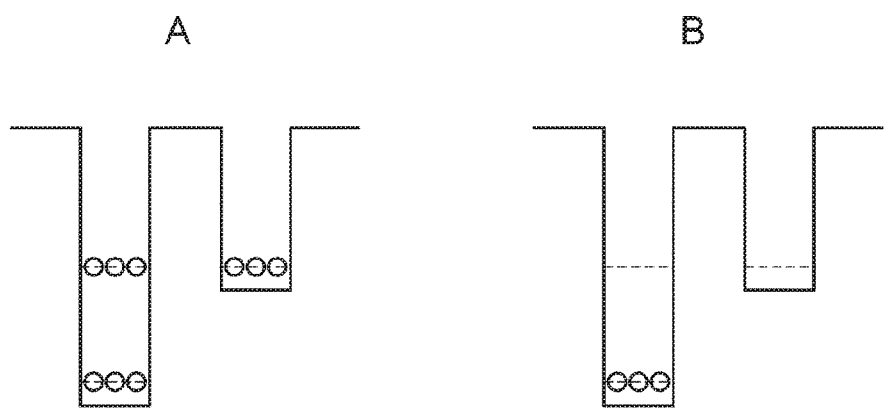

A laser device, an information acquisition device, and an imaging system according to the present disclosure will be described below. FIGS. 1A and 1B are schematic views illustrating an outline of a laser device according to at least one embodiment of the present disclosure.

A laser device according to the present disclosure includes a wavelength-tunable type surface emitting laser 1 and an excitation unit for exciting the surface emitting laser 1. In FIG. 1A, the excitation unit includes a first exciting light source 2 and a second exciting light source 3. In addition, the first exciting light source 2 and the second exciting light source 3 are provided so that different areas of an active layer included in the surface emitting laser 1 are excited. Furthermore, while the first exciting light source 2 emits light with peak wavelength $\lambda_1$ the second exciting light source 3 emits light with peak wavelength $\lambda_2$ longer than the peak wavelength $\lambda_1$. That is, the first exciting light source 2 and the second exciting light source 3 emit different peak wavelength. Moreover, the spectrum of the light emitted by the first exciting light source 2 is different from the spectrum of the light emitted by the second exciting light source 3.

An MEMS-VCSEL described above can be used for the surface emitting laser 1. Specifically, the surface emitting laser 1 has a pair of reflectors including a first reflector 11 and a second reflector 12, and an active layer 13 provided between the pair of reflectors. The surface emitting laser 1 emits light in the direction where the pair of reflectors and the active layer 13 are stacked (Z direction in FIG. 1A). In addition, the first reflector 11 is a moving mirror, and cavity length of a resonator formed of the pair of reflectors is changed by moving this moving mirror so that the oscillation wavelength of the surface emitting laser 1 can be changed. A known method such as electrostatic force and thermal expansion can be used for driving the moving mirror. In addition, a space 14 is provided between the moving mirror and the active layer of the surface emitting laser 1 for driving the moving mirror. Note that, in the surface emitting laser 1, a spacer layer for adjusting cavity length may be provided between the active layer 13 and the second reflector 12 and between the active layer 13 and the space 14.

In addition, the active layer of the surface emitting laser 1 may include a single quantum well layer or a multi-quantum well layer. Moreover, it is more preferable that the active layer include an asymmetric multi-quantum well layer in order to widen the wavelength tunable width.

The asymmetric multi-quantum well layer refers to a layer with a plurality of well layers for forming a multi-quantum well layer in which at least one of the width, the depth, and the amount of distortion against the substrate of at least one well layer is different from that of the remaining well layers. Alternatively, the asymmetric multi-quantum well layer refers to a layer with a plurality of barrier layers for forming a multi-quantum well layer in which at least one of the width, the height, and the amount of distortion against the substrate of at least one barrier layer is different from the remaining barrier layers. In order to change the width of the well layer or the width of the barrier layer, it is only required to change the thickness of each well layer or the thickness of each barrier layer. In addition, the depth of the well layer and the height of the barrier layer are determined by a difference of conduction band energy or valence band energy between the barrier layer and the well layer. Therefore, in order to change the depth of the well layer or the height of the barrier layer, it is only required to change a material or composition used for the well layer or the barrier layer. If a material or composition used for the well layer or the barrier layer is changed, the amount of distortion of the well layer or the barrier layer can also be changed.

The first exciting light source 2 and the second exciting light source 3 may have any structure in so far as the surface emitting laser 1 can be excited. For example, light emitting diode, super luminescence diode (hereinafter referred to as "SLD"), edge emitting laser, or surface emitting laser can be used for the first exciting light source 2 and the second exciting light source 3.

An effect of at least one embodiment of the present disclosure will be described below. As described above, in at least one embodiment of the present disclosure, the first exciting light source 2 and the second exciting light source 3 are provided so that different areas of the active layer included in the surface emitting laser 1 are excited. With this structure, the active layer of the surface emitting laser 1 is excited by light emitted from the first exciting light source 2 and the second exciting light source 3. Since the peak wavelength $\lambda_1$ is shorter than the peak wavelength $\lambda_2$, excitation energy is large. Therefore, the amount of generation of carriers that are electrons and holes becomes large since the active layer is excited more in the first area A irradiated with light with the peak wavelength $\lambda_1$ at the first exciting light source 2 than the second area B irradiated with light with the peak wavelength $\lambda_2$ at the second exciting light source 3 side in the active layer 13.

FIG. 1B illustrates a carrier occupation state of each energy level of the quantum well layer when the active layer 13 is made of two quantum well layers with different well layer depth. A case in which the active layer 13 includes two quantum well layers with different well layer depth, in other words asymmetric multi-quantum well layers, will be described below. The state A in FIG. 1B shows a carrier occupation state of an energy level of each well layer of the active layer 13 in the first area A described above. In the first area A, since excited energy is large and the number of generated carriers is large, carriers (electrons) can occupy up to higher-order level of each quantum well layer. Therefore, in the first area A, it is easy to oscillate with short wavelength due to a higher-order level. In other words, in the first area A of the active layer 13, it is possible to say that optical gain factor is large with short wavelength.

On the other hand, the state B in FIG. 1B shows a carrier occupation state of an energy level of each well layer of the active layer 13 in the second area B described above. In the second area B, since excited energy is small and the number of generated carriers is small, carriers (electrons) can only occupy at a ground level (n=1) with small energy. Therefore, in the second area B, it is easy to oscillate with long wavelength due to a ground level (n=1). In other words, in the second area B of the active layer 13, it is possible to say that optical gain factor is large with long wavelength.

As described, the first exciting light source 2 and the second exciting light source 3 excite the active layer 13 of the surface emitting laser 1 so that a carrier occupation state of an energy level of each well layer of active layer 13 in the first area A is different from that in the second area B. Then, a carrier occupation state of an energy level of each well layer of the active layer 13 is formed so that different wavelength is easily oscillated in the first area A and the second area B in the in-plane direction (XY in-plane direction in FIG. 1A) of the active layer 13 of the surface emitting laser 1. With this structure, the active layer 13 can easily oscillate both short wavelength and long wavelength. That is, according to at least one embodiment of the present disclosure, since the carrier occupation state described above is formed in the active layer 13, an optical gain factor is large from short wavelength to long wavelength, and it is possible to vary wavelength in accordance with driving of the moving mirror without mode hopping, so that the wavelength tunable width is widen. Note that, the in-plane direction of the active layer 13 is the in-plane direction that intersects with the light output direction (Z direction in FIG. 1A) of the surface emitting laser 1.

If light with the same peak wavelength is emitted from the first exciting light source 2 and the second exciting light source 3 to excite the surface emitting laser 1, a carrier occupation state of an energy level of each well layer as described above is not formed. For example, when light with peak wavelength $\lambda_1$ is emitted from the first exciting light source 2 and the second exciting light source 3, the active layer 13 becomes a carrier occupation state with an energy level in which it is easily oscillate with short wavelength in both the first area A and the second area B, and an optical gain factor becomes large with short wavelength. However, since an optical gain factor is small in long wavelength, oscillation with long wavelength does not occur and oscillation of short wavelength may occur due to mode hopping even if the moving mirror is driven and the moving mirror is provided at a position to increase cavity length for oscillation with long wavelength. Therefore, the wavelength tunable width becomes small. If light with the peak wavelength $\lambda_2$ is emitted from the first exciting light source 2 and the second exciting light source 3, a threshold value with short wavelength becomes small and it will be difficult to obtain oscillation with short wavelength. In addition, since a threshold value becomes similarly larger with short wavelength or long wavelength than at least one embodiment of the present disclosure also when light with wavelength between the peak wavelength $\lambda_1$ and the peak wavelength $\lambda_2$ is emitted from the first exciting light source 2 and the second exciting light source 3, the wavelength tunable width becomes smaller than at least one embodiment of the present disclosure due to mode hopping or non-oscillation.

Note that, although an example in which the active layer 13 includes asymmetric multi-quantum well layers is described in FIG. 1B, the present disclosure is not limited thereto. Since carriers (electrons) occupy up to a higher-order level in the first area A in the active layer 13 of the first exciting light source 2 side even if the active layer 13 is a single quantum well layer or a symmetric multi-quantum well layer (which does not satisfy the condition of asymmetric multi-quantum well layer), short wavelength is easily oscillated. Then, since carriers are occupied only up to a ground level or a lower-order level in the second area B in the active layer 13 of the second exciting light source 3 side, it is a part in which long wavelength is easily oscillated. As described, if the excitation unit excites the active layer 13 of the surface emitting laser 1 so that a carrier occupation state with an energy level can be oscillated with different wave length in different areas in the active layer 13 of the surface emitting laser 1, at least one effect of one or more embodiments of the present disclosure can be obtained.

It is preferable that the peak wavelength $\lambda_1$ be shorter than central wavelength of variable bandwidth of the wavelength and the peak wavelength $\lambda_2$ be larger than central wavelength of variable bandwidth of the wavelength. In addition, it is preferable that the peak wavelength $\lambda_1$ be equal to or shorter than wavelength corresponding to a higher-order energy level of the quantum well layer that forms the active layer 13. Moreover, it is preferable that the peak wavelength $\lambda_2$ be equal to or less than wavelength corresponding to a ground energy level of the quantum well layer that forms the active layer 13. Furthermore, it is preferable that the peak wavelength $\lambda_2$ be longer than wavelength corresponding to a higher-order energy level of the quantum well layer that forms the active layer 13.

In addition, method for forming in-plane distribution of a carrier occupation state of an energy level in the active layer 13 includes current injection. Although details will be described later, a method in which a plurality of electrodes that inject carriers in the active layer 13 are provided at different positions of the surface emitting laser 1 with the surface emitting laser 1 being a current injection type, and current with different amount is injected from the plurality of electrodes may be employed.

(Active Layer)

A material for the active layer is not limited as long as it is a material that emits light. If light with wavelength band range near 850 nm is to be emitted, a material with a quantum well structure made from $Al_nGa_{1-n}As$ ($0 \leq n \leq 1$) may be used. In addition, if light with wavelength band range near 1060 nm is to be emitted, a material made from $In_nGa_{1-n}As$ ($0 \leq n \leq 1$) may be used.

In addition, it is preferable that the active layer have a sufficiently large gain, and more particularly, it is preferable that the active layer have a gain in a wavelength area larger than the reflex band of the first reflector and the second reflector. Such an active layer includes an active layer with an asymmetric quantum well structure as described above. The material and structure of the active layer according to the present embodiment may be appropriately selected according to wavelength to be oscillated.

(First Reflector and Second Reflector)

For example, each of the first reflector and the second reflector is distributed Bragg reflector (hereinafter referred to as "DBR") in which layers with a high refractive index and layers with a low refractive index are alternately stacked with optical thickness ¼ wavelength. It is preferable that the reflector have as high reflectivity as possible in a broad band region in order to increase a wavelength variable range. One of a DBR with a semiconductor and a DBR with a dielectric material can be used for the first reflector and the second reflector. Generally, since a DBR with a dielectric material can increase refractive index difference between a layer with a high refractive index and a layer with a low refractive index more than a DBR with a semiconductor, a DBR with a dielectric material can realize a high reflectivity with smaller number of stacked layers. On the other hand, although the number of pairs becomes large in a DBR with a semiconductor, it has advantages in a process that films can be formed at the same time during crystal growth and it is possible to cause current to flow by doping.

For simultaneous forming by epitaxial growth, while a semiconductor DBR can be used for both the second reflector and the first reflector, a dielectric material DBR may be used for the first reflector to gain a high reflectivity in a broader band region. Note that, when a dielectric material DBR is used for the first reflector, a dielectric material DBR may be formed over a semiconductor layer. As a material of the first reflector, $Al_{0.4}Ga_{0.6}As$ and $Al_{0.9}Ga_{0.1}As$ can be used for a semiconductor DBR and silicon oxide and titanium oxide can be used for a dielectric material DBR. GaAs and AlAs can be used for the second reflector.

In addition, high index contrast subwavelength grating (hereinafter referred to as "HCG") may be used for a reflector. An HCG has a structure in which materials with a high refractive index and materials with a low refractive index are alternately and regularly arranged in the in-plane direction. An example of an HCG includes a periodic structure with high refractive index areas (AlGaAs areas) and low refractive areas (gaps) in which spaces are regularly provided by processing a semiconductor layer such as AlGaAs layer. The first reflector, which is a moving mirror, is required to be a light reflector in terms of high-speed wavelength variation, and it is preferable that an HCG be used. Note that, ones disclosed in the U.S. Pat. No. 8,059,690 and the U.S. Pat. No. 8,189,643 can be used as an HCG.

(Space)

Normally, solid does not exist in a space. Therefore, depending on its atmosphere, a space may be vacuum, or air, inert gas, or fluid such as water may exist. Note that, the length of the structure of a space in the thickness direction can be determined in consideration of wavelength tunable width or pull-in of the moving mirror. For example, if wavelength is to be varied with the wavelength tunable width of 100 nm with the center being 1060 nm and with air in the space, the length of the space is about 2 µm.

Embodiments of the present disclosure will be described below. Note that, in this specification, the substrate side of the surface emitting laser is referred to as lower side and the side opposite to the substrate is referred to as upper side.

First Embodiment

Figure 2A:
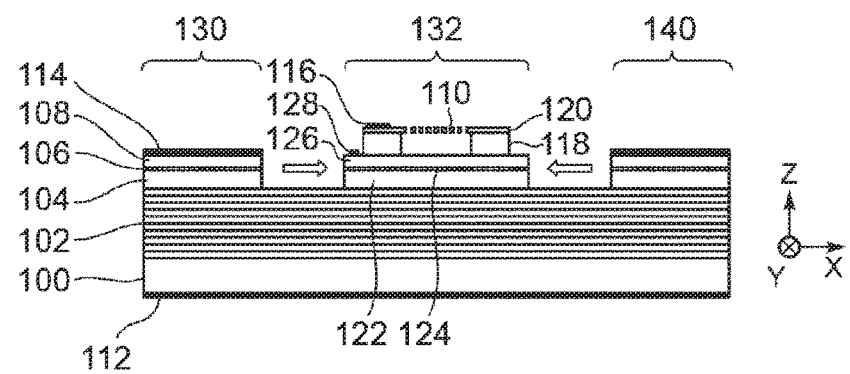
FIGS. 2A, 2B, and 2C are schematic views illustrating an example of a laser device according to a first embodiment of the present disclosure.
Figure 2B:
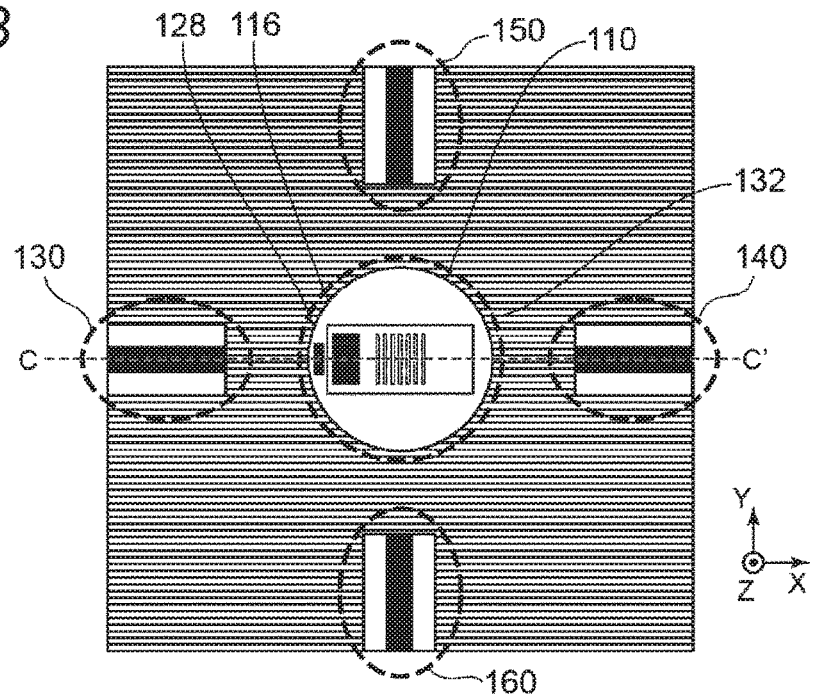
Figure 2C:
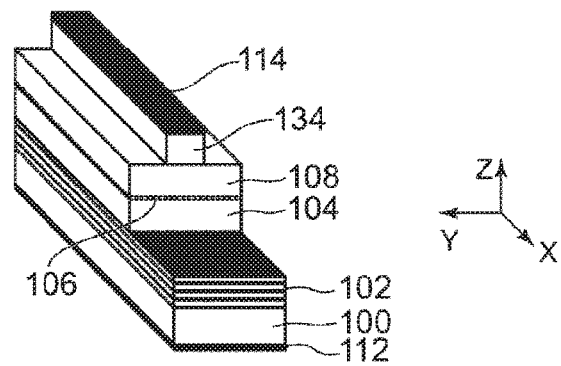

FIGS. 2A to 2C are schematic views illustrating an example of a laser device according to the present embodiment. FIG. 2A is a cross-sectional schematic view illustrating a laser device according to the present embodiment. FIG. 2B is an upper schematic view illustrating a laser device according to the present embodiment, and FIG. 2A corresponds to the cross-section C-C' in FIG. 2B. As illustrated in FIGS. 2A and 2B, a laser device according to the present embodiment includes a surface emitting laser 132 and exciting light sources 130, 140, 150, and 160 for exciting the surface emitting laser 132. In the present embodiment, the exciting light sources 130, 140, 150, and 160 are edge emitting laser. The exciting light sources 130 and 140 emit light with peak wavelength $\lambda_1$, and the exciting light sources 150 and 160 emit light with peak wavelength $\lambda_2$ that is different from the peak wavelength $\lambda_1$ of the exciting light sources 130 and 140. That is, the exciting light sources 130 and 140 correspond to the first exciting light source 2 of FIG. 1A, and the exciting light sources 150 and 160 correspond to the second exciting light source 3 of FIG. 1A. Note that, although an example with four exciting light sources has been described in the present embodiment, it is only required to have at least two exciting light sources each of which emits light with different peak wavelength. In addition, although two types of light sources have been used, three or more types of exciting light sources that emit light with different peak wavelength may be used. Moreover, since the exciting light source is laser, the peak wavelength in the present embodiment corresponds to oscillation wavelength.

As illustrated in FIG. 2A, the surface emitting laser 132 includes a bottom reflector (corresponding to the second reflector) 102, a first lower spacer layer 122, an active layer 124, a first upper spacer layer 126, and a top reflector (corresponding to the first reflector) 110 in this order from the substrate 100 side. The top reflector 110 is supported by a beam 120 and the beam 120 is supported by a supporting layer 118 formed over the first upper spacer layer 126. A first electrode 116 is formed over the beam 120. A second electrode 128 is formed over the first upper spacer layer 126.

The beam 120 is made of a member with conductivity. Alternating voltage is applied between the first electrode 116 and the second electrode 128 to vibrate the beam 120 in the thickness direction (Z direction) of the active layer 124. As a result, the top reflector 110 also vibrates in the thickness direction of the active layer 124, cavity length of a pair of reflectors including the top reflector 110 and the bottom reflector 102 is varied, and light with specific wavelength in accordance with the cavity length out of the light emitted from the active layer 124 is emitted to the outside. Accordingly, the oscillation wavelength of the surface emitting laser can be varied.

Note that, the active layer 124 is excited by an exciting light source described later to emit light.

The exciting light source 130 (140) includes a second lower spacer layer 104, an active layer 106, and a second upper spacer layer 108 in this order from the substrate 100 side. Exciting light sources 150 and 160 of FIG. 2B that are not illustrated in FIG. 2A have the same structure. The exciting light sources 130, 140, 150, and 160 are formed on the same substrate 100 as the surface emitting laser 132. In addition, each of the second lower spacer layer 104, the active layer 106, and the second upper spacer layer 108 of the exciting light source 130 (140, 150, and 160) may be made from the same material as the first lower spacer layer 122, the active layer 124, and the first upper spacer layer 126 of the surface emitting laser respectively. In that case, regrowth is not necessary and it is possible to form each layer serving as the surface emitting laser 132 and the exciting light source 130 (140, 150, and 160) by the same process. Note that, the second lower spacer layer 104, the active layer 106, and the second upper spacer layer 108 of the exciting light source 130 (140, 150, and 160) may be made from a material different from that of the first lower spacer layer 122, the active layer 124, and the first upper spacer layer 126 of the surface emitting laser respectively. In addition, the surface emitting laser 132 and the exciting light source 130 (140, 150, and 160) may not be formed on the same substrate 100.

In addition, a third electrode 114 is formed over the second upper spacer layer 108. In addition, a fourth electrode 112 is formed under the substrate 100. The active layer 106 emits light by injecting current between the third electrode 114 and the fourth electrode 112. Note that, although the fourth electrode 112 is formed to the area of the surface emitting laser 132, the fourth electrode 112 and the second electrode 128 is set (grounded) to the same potential. Therefore, since current is not injected between the second electrode 128 and the fourth electrode 112, current does not flow in the surface emitting laser 132.

In addition, FIG. 2C is a perspective schematic view illustrating the exciting light source 130 (140, 150, and 160). The exciting light source 130 (140, 150, and 160) can serve as a light waveguide called a ridge 134, and is formed over the second upper spacer layer 108. Moreover, the third electrode 114 is formed over the ridge 134.

In addition, the exciting light sources 130 and 140 and the exciting light sources 150 and 160 are formed so that cavity length is different from each other. That is, length in the Y-direction, which is the oscillation direction of the exciting light sources 150 and 160, is longer than length in the X-direction, which is the oscillation direction of the exciting light sources 130 and 140. With this structure, it is possible to change oscillation wavelength of the exciting light sources 130 and 140 and the exciting light sources 150 and 160. Specifically, the peak wavelength (oscillation wavelength) $\lambda_2$ of the exciting light sources 150 and 160 is longer than the peak wavelength (oscillation wavelength) $\lambda_1$ of the exciting light sources 130 and 140.

Therefore, due to simultaneous emission of excitation light of the exciting light sources 130, 140, 150, and 160, in-plane distribution of a carrier occupation state of an energy level is formed in which the surface emitting laser 132 can oscillate with different wavelength in the active layer 124 of the surface emitting laser 132. Therefore, as described above, it is possible to increase the wavelength tunable width.

Note that, the exciting light sources 130 and 140 are provided to face each other with the surface emitting laser 132 provided between the exciting light sources 130 and 140, and the exciting light sources 150 and 160 are provided to face each other with the surface emitting laser 132 provided between the exciting light sources 150 and 160. As described, when two exciting light sources that emit light with the same peak wavelength are provided, it is preferable that these two exciting light sources be provided to face each other with the surface emitting laser 132 provided between these two exciting light sources.

The surface emitting laser 132 and the exciting light sources 130, 140, 150, and 160 can be formed by a known epitaxial growth method, sacrifice layer etching method, photolithography method, and the like. In addition, by applying high-reflectivity coating to the surface opposite to the light emitting surface of the exciting light sources 130, 140, 150, and 160, it is possible to cause the light emitting surface to efficiently emit laser beam.

(Beam)

The beam may be supported by two support areas or may be supported by three or more support areas. In addition, the beam may be supported at one location such as silicon cantilever. Moreover, a component for relieving stress or the like attribute to distortion in crystal growth or operation environment temperature may be formed to the beam.

The beam is not particularly limited as long as it can vary cavity length. For example, a method for driving the beam includes a method for driving the beam by an electrostatic force as in the present embodiment, a method for mechanically driving the beam with a piezoelectric material, and a method for driving the beam with expansion and contraction due to heat.

In addition, the beam may also serve as a top reflector as in the present embodiment, or may be a separate component from a top reflector. In the latter case, it is only required to provide a top reflector at a position corresponding to the light-emitting section area of the beam, that is, a position corresponding to the light-emitting area, and the top reflector may be provided over or under the beam. In addition, it is also possible to employ a structure in which a through hole is provided at a position corresponding to the light-emitting area of the beam, and the top reflector is provided in the through hole.

(First Electrode, Second Electrode, Third Electrode, and Fourth Electrode)

The first electrode, the second electrode, the third electrode, and the fourth electrode can be made from single metal such as titanium and gold, alloy, or stacked body of metal films. For example, Ti/Au and AuGe/Ni/Au can be used as an electrode material. The second electrode can be provided at any position as long as it is over the first upper spacer layer.

(First Upper Spacer Layer, First Lower Spacer Layer, Second Upper Spacer Layer, and Second Lower Spacer Layer)

The first upper spacer layer and the second upper spacer layer may be made from the same semiconductor material or may be made from different semiconductor materials. Similarly, the first lower spacer layer and the second lower spacer layer may be made from the same semiconductor material or may be made from different semiconductor materials. GaAs, AlGaAs, and the like can be used as a semiconductor material.

In addition, the second upper spacer layer and the second lower spacer layer have conductivity. For example, if they are p-type, appropriate amount of acceptor such as Mg is doped. On the other hand, if they are n-type, appropriate amount of donor such as Si is doped. Note that, acceptor and donor may also be doped to the first upper spacer layer and the first lower spacer layer. These spacer layers may be formed of monolayer or may include a plurality of layers.

(Active Layer of Exciting Light Source)

The active layer of the exciting light source may be made from the same semiconductor material as that of the active layer of the surface emitting laser, or may be made from a different semiconductor material. In addition, the active layer of the exciting light source may include an asymmetric multi-quantum well layer or may include single quantum well layer or a symmetric multi-quantum well layer. Moreover, the material, the thickness, and the like of the active layer may be appropriately changed in accordance with peak wavelength of light emitted from the exciting light source or they may be the same. GaAs, AlGaAs, and the like can be used as a semiconductor material.

Second Embodiment

Figure 3A:
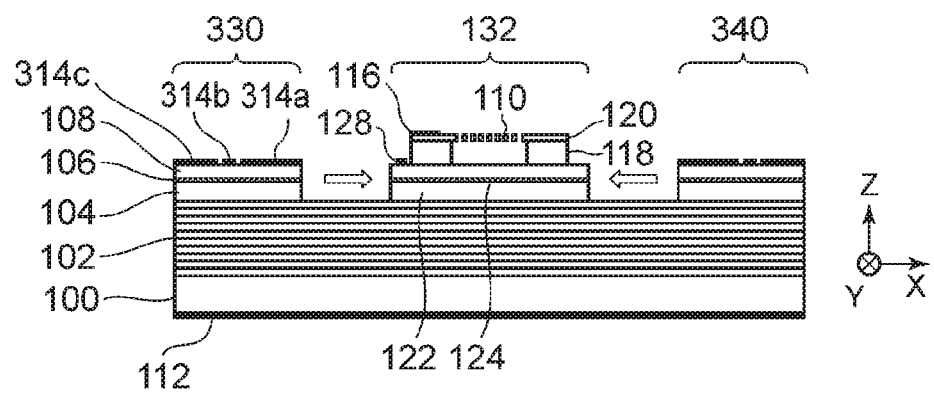
FIGS. 3A and 3B are schematic views illustrating an example of a laser device according to a second embodiment of the present disclosure.
Figure 3B:
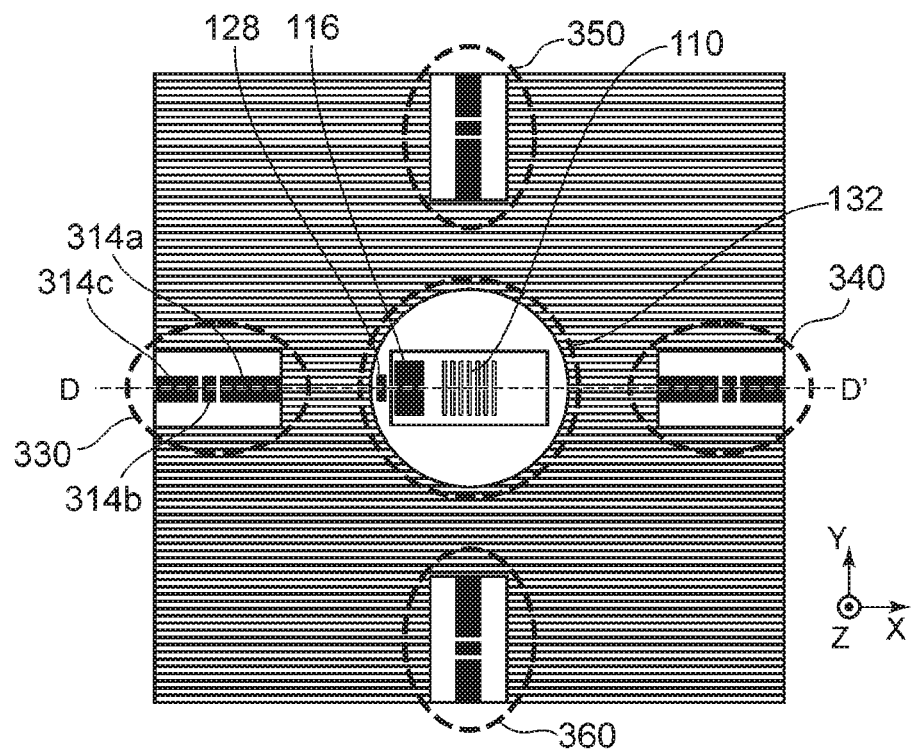

FIGS. 3A and 3B are schematic views illustrating an example of a laser device according to the present embodiment. FIG. 3A is a cross-sectional schematic view illustrating a laser device according to the present embodiment. FIG. 3B is an upper schematic view illustrating a laser device according to the present embodiment, and FIG. 3A corresponds to the cross-section D-D' in FIG. 3B. As illustrated in FIGS. 3A and 3B, a laser device according to the present embodiment includes the surface emitting laser 132 and exciting light sources 330, 340, 350, and 360 for exciting the surface emitting laser 132. While the exciting light sources 130, 140, 150, and 160 are edge emitting laser in the first embodiment, the exciting light sources 330, 340, 350, and 360 are SLD in the present embodiment. Other structures are the same as those of the first embodiment.

The exciting light sources 330 and 340 emit light with peak wavelength $\lambda_1$, and the exciting light sources 350 and 360 emit light with peak wavelength $\lambda_2$ that is different from the peak wavelength $\lambda_1$ of the exciting light sources 330 and 340. That is, the exciting light sources 330 and 340 correspond to the first exciting light source 2 in FIG. 1A, and the exciting light sources 350 and 360 correspond to the second exciting light source 3 in FIG. 1A.

The structure of the exciting light sources 330, 340, 350, and 360 is the same. The third electrode of each of the exciting light sources 330, 340, 350, and 360 is split into a first split electrode 314a, a second split electrode 314b, and a third split electrode 314c. It is possible to adjust peak wavelength of the exciting light sources 330, 340, 350, and 360 by adjusting current injection density of the first split electrode 314a, the second split electrode 314b, and the third split electrode 314c. For example, it is possible to shorten the peak wavelength by making current injection density injected from the first split electrode 314a larger than current injection density injected to the second split electrode 314b and the third split electrode 314c. In addition, it is possible to increase peak wavelength by making current injection density injected to the third split electrode 314c larger than current injection density injected to the first split electrode 314a and the second split electrode 314b. As described, the exciting light sources 330 and 340 emit light with peak wavelength $\lambda_1$ and the exciting light sources 350 and 360 emit light with peak wavelength $\lambda_2$ by adjusting current injection density of the first split electrode 314a, the second split electrode 314b, and the third split electrode 314c. In addition, with such a current adjustment, it is possible to adjust not only peak wavelength but also spectrum, and it is also possible to form in-plane distribution of a carrier occupation state with a desired energy level in the active layer 13. Note that, one disclosed in Japanese Patent Laid-Open No. 2014-082485 can be used as an SLD including a plurality of split electrodes.

Moreover, it is preferable that the length of a ridge of the SLD accommodate to peak wavelength in addition to adjustment of current injection density of the first split electrode 314a, the second split electrode 314b, and the third split electrode 314c. With this structure, it is possible to more effectively cause peak wavelength and spectrum of light emitted from the exciting light source to be a desired value and it is possible to form desired carrier density distribution in the active layer.

Note that, a plurality of exciting light sources may include both the edge emitting laser described in the first embodiment and the SLD described in the present embodiment.

Third Embodiment

Figure 4:
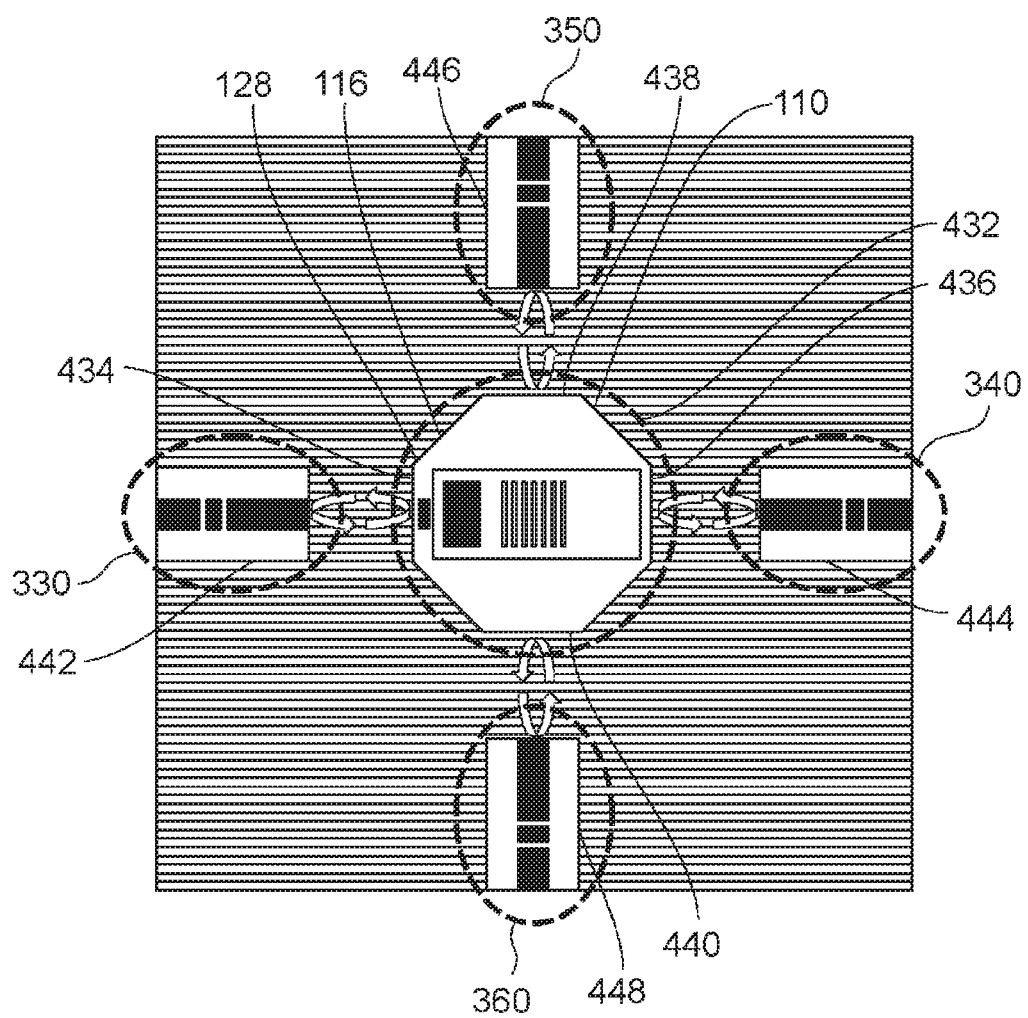
FIG. 4 is a schematic plan view illustrating an example of a laser device according to a third embodiment of the present disclosure.

FIG. 4 is an upper schematic view illustrating an example of a laser device according to the present embodiment. As illustrated in FIG. 4, a laser device according to the present embodiment includes a surface emitting laser 432 and the exciting light sources 330, 340, 350, and 360 for exciting the surface emitting laser 432. The present embodiment is different from the second embodiment in that a resonator is formed between the light emitting surface of the exciting light sources 330, 340, 350, and 360 and the light incident surface of the surface emitting laser 432. Other structures are same as the second embodiment. Note that, the exciting light sources 330, 340, 350, and 360 may be edge emitting laser as with the exciting light sources 130, 140, 150, and 160 of the first embodiment.

In the present embodiment, a light incident surface 434 where light emitted from the exciting light source 330 of the surface emitting laser 432 is incident is formed on a plane substantially parallel to a light emitting surface 442 of the exciting light source 330. Each of light incident surface 436, 438, and 440 of the surface emitting laser 432 is formed on a plane substantially parallel to light emitting surfaces 444, 446, and 448, respectively, of the exciting light source 330. In addition, the distance between the light emitting surface 442 of the exciting light source 330 and the light incident surface 434 is the distance for being a resonator to resonate the peak wavelength $\lambda_1$. Moreover, the distance between the light emitting surface 444 of the exciting light source 330 and the light incident surface 436 is the distance for being a resonator to resonate the peak wavelength $\lambda_1$. Furthermore, the distance between the light emitting surface 446 of the exciting light source 330 and the light incident surface 438 is the distance for being a resonator to resonate the peak wavelength $\lambda_2$, and the distance between the light emitting surface 448 of the exciting light source 330 and the light incident surface 440 is the distance for being a resonator to resonate the peak wavelength $\lambda_2$. With such a structure, it is possible to strengthen peak wavelength of light emitted from the exciting light sources 330, 340, 350, and 360, and it is possible to efficiently form in-plane distribution of a carrier occupation state with an energy level in the active layer of the surface emitting laser 432.

Fourth Embodiment

Figure 5A:
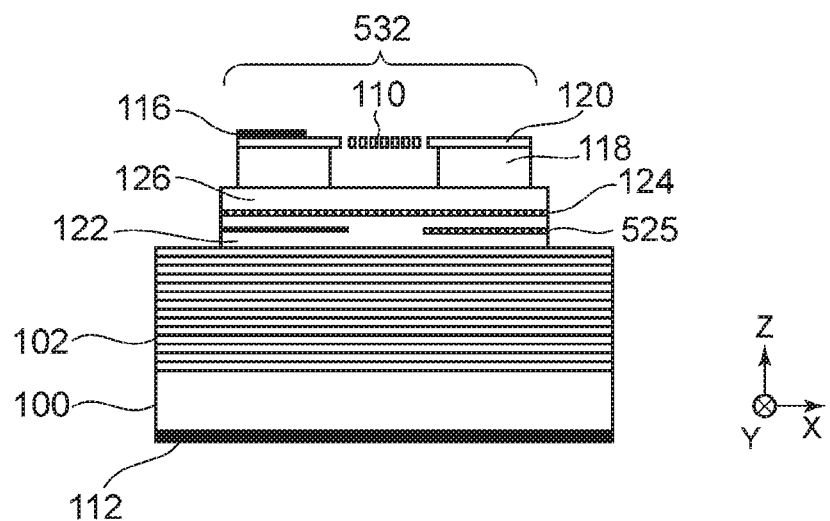
FIGS. 5A and 5B are schematic views illustrating an example of a laser device according to a fourth embodiment of the present disclosure.
Figure 5B:
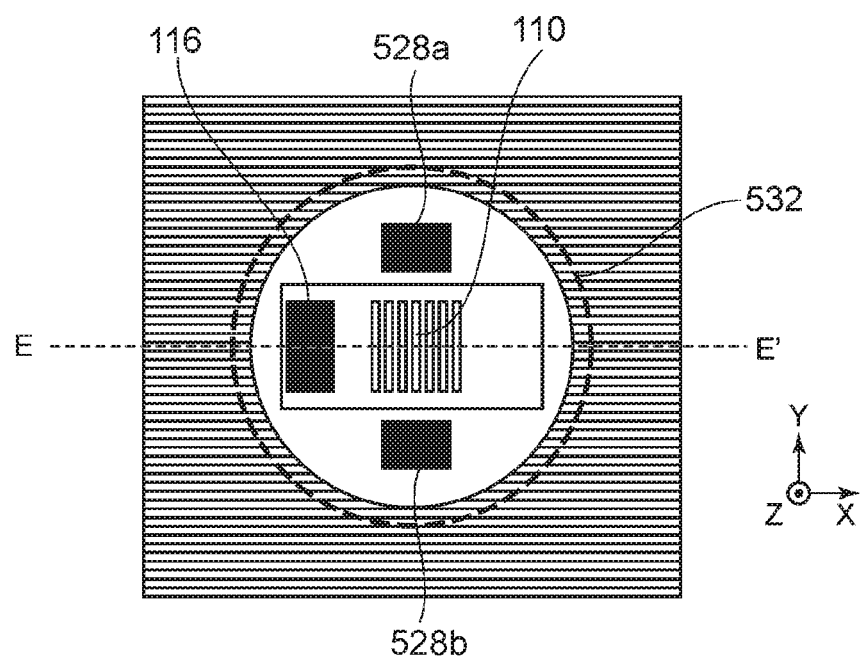

FIGS. 5A and 5B are schematic views illustrating an example of a laser device according to the present embodiment. FIG. 5A is a cross-sectional schematic view illustrating a laser device according to the present embodiment. FIG. 5B is an upper schematic view illustrating a laser device according to the present embodiment, and FIG. 5A corresponds to the cross-section E-E' in FIG. 5B.

While a structure in which an active layer of a surface emitting laser is excited by photoexcitation has been described in the first to third embodiments, a surface emitting laser 532 according to the present embodiment is current injection type. Specifically, as illustrated in FIG. 5B, in the surface emitting laser 532, fifth electrodes are formed over the first upper spacer layer 126 with the top reflector 110 provided between the fifth electrodes. The fifth electrodes are two split electrodes 528a and 528b. Each of the split electrodes 528a and 528b independently injects current. In addition, the potential of the split electrodes 528a and 528b is not the same as that of the fourth electrode 112, which is difference from the first to third embodiments. Therefore, when current is injected between the split electrodes 528a and 528b and the fourth electrode 112, electrons and holes are supplied to the active layer 124 and they are recombined, and the active layer 124 emits light.

In addition, in the present embodiment, carriers are injected to the first upper spacer layer 126 from the split electrodes 528a and 528b with different current injection density. Therefore, in-plane distribution of a carrier occupation state with an energy level with which different wavelength is oscillated in different areas is formed in the XY in-plane direction of the active layer 124. Note that, the surface emitting laser 532 includes a current confinement layer 525. This is to cause current to flow in the light-emitting area in the active layer 124 to improve light emission efficiency.

(Current Confinement Layer)

The current confinement layer includes an oxidized region selectively oxidized by a selectively oxidized process as a high-resistance part and a non-oxidized region not oxidized as a low-resistance part. In order to oxidize by a selectively oxidized process, an AlAs layer or an $Al_{0.98}Ga_{0.02}As$ layer with high Al composition ratio is preferably used, for example. $Al_xO_y$ is formed and a current confinement layer is formed by selectively oxidizing that layer in a high temperature water vapor atmosphere. Light-emitting shape can be controlled by controlling the shape of the non-oxidized region. The size of the non-oxidized region, that is, the light-emitting area, is about 5 μm to 15 μm.

It is only required to form the current confinement layer in the first upper spacer layer or the first lower spacer layer. In addition, there may be a plurality of current confinement layers. In that case, the plurality of current confinement layers may be formed over or under the active layer or may be formed both over and under the active layer.

(Contact Layer)

Since carriers are injected in the active layer with the fifth electrode and the fourth electrode in the present embodiment, it is preferable to have a contact layer that directly contacts with the fifth electrode. The contact layer is not particularly limited as long as carriers are easily injected from the fifth electrode. For example, the contact layer is a semiconductor layer including dopant. In this case, for example, it is preferable that the doping concentration of the dopant be $3\times10^{18}$ cm$^{-3}$ or more. In addition, in order to prevent absorption of light emitted in the active layer, it is preferable that the doping concentration be $5\times10^{13}$ cm$^{-3}$ or less.

In order to improve carrier mobility, while dopant may be included in a semiconductor layer other than the contact layer such as spacer layer, it is preferable that the doping concentration of the contact layer be the highest in the semiconductor layers between the fifth electrode and the fourth electrode.

Fifth Embodiment

In the present embodiment, an example of an information acquisition device with the laser device according to any of the first to fourth embodiments as a light source device will be described. A wavelength-tunable type light source device can be used as a light source for optical communication and a light source for optical measurement. In addition, a wavelength-tunable type light source device can be used as a light source device of an information acquisition device that acquires information inside a measurement object in a non-invasive and non-destructive manner. An optical coherence tomography imaging system (hereinafter referred to as "OCT system") will be described below with reference to FIG. 6 as an example of an information acquisition device with a light source device according to the present embodiment.

Figure 6:
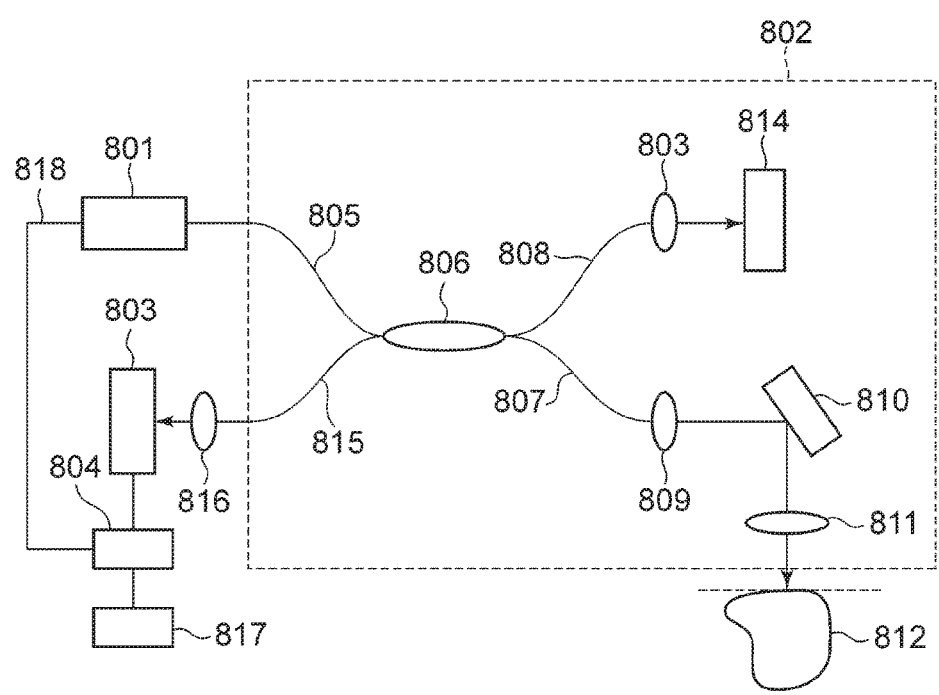
FIG. 6 is a schematic view illustrating an example of an optical coherence tomography imaging system according to a fifth embodiment of the present disclosure.

FIG. 6 is a schematic view illustrating an OCT system according to the present embodiment. An OCT system at lease includes a light source device 801, an interfering optical system 802, a light detecting unit 803, and an information acquiring unit 804 for acquiring information inside a measurement object. The laser device according to any of Embodiments 1 to 3 can be used as the light source device 801. In addition, although not illustrated, the information acquiring unit 804 includes a Fourier transformer. Here, Fourier transformer included in the information acquiring unit 804 is not particularly limited as long as the information acquiring unit 804 has a Fourier transform function for input data. An example is a case in which the information acquiring unit 804 includes a calculation unit and this calculation unit has a Fourier transform function. Specifically, this is a case in which the calculation unit is a computer including a CPU and this computer executes an application having a Fourier transform function. Another example is a case in which the information acquiring unit 804 includes a Fourier transform circuit having a Fourier transform function.

Light from the light source device 801 is output as interfering light with information of a measurement object 812 via the interfering optical system 802. The interfering light is received by the light detecting unit 803. Note that, the light detecting unit 803 may be differential detection type or simple intensity monitor type. Information of time waveform of intensity of the received interfering light is transmitted to the information acquiring unit 804 from the light detecting unit 803. The information acquiring unit 804 acquires and applies Fourier transformation to a peak value of time waveform of intensity of the received interfering light and acquires information of the object 812 (for example, information of a tomographic image). Note that, the light source device 801, the interfering optical system 802, the light detecting unit 803, and the information acquiring unit 804 mentioned here can be arbitrarily provided.

Irradiation light from the light source device 801 to acquisition of information inside a measurement object will be described below in detail. Light emitted from the light source device 801 enters a coupler 806 via a fiber 805 and is divided into irradiation light that passes through a fiber 807 for reference light and reference light that passes through a fiber 808 for reference light. The coupler 806 operates in a single state with wavelength band range of the light source and each fiber coupler is a 3 dB coupler. The irradiation light becomes parallel light via a collimator 809 and is reflected by a mirror 810. An object 812 is irradiated with the light reflected by the mirror 810 via a lens 811 and the light is reflected by each layer in the depth direction of the object 812.

On the other hand, the reference light is reflected by a mirror 814 via a collimator 813. Interfering light by the reflected light from the object 812 and the reflected light from the mirror 814 is generated in the coupler 806. The interfering light passes through a fiber 815 and is condensed through a collimator 816 and received by the light detecting unit 803. Information of intensity of the interfering light received by the light detecting unit 803 is converted into electric information such as voltage and transmitted to the information acquiring unit 804. In the information acquiring unit 804, data of intensity of the interfering light is processed, specifically, Fourier-transformed, and information of a tomographic image is obtained. Although data of intensity of the interfering light to be Fourier-transformed is normally data sampled at constant wavenumber interval, it is also possible to use data sampled at equal wavelength interval.

Information of the obtained tomographic image may be transmitted from the information acquiring unit 804 to the image display portion 817 to be displayed as an image. Note that, a three-dimensional tomographic image of the measurement object 812 can be obtained by scanning the mirror 810 in a plane vertical to the direction of incidence of the irradiation light. In addition, the light source device 801 may be controlled by the information acquiring unit 804 via an electric circuit 818. Moreover, although not illustrated, intensity of light from the light source device 801 may be sequentially monitored and that data may be used for amplitude correction of a signal of intensity of the interfering light.

An OCT system is useful for obtaining a tomographic image in a biological body such as animal and human in a field of ophthalmology, dentistry, dermatology, and the like. Information regarding a tomographic image of a biological body is not only a tomographic image of a biological body but includes value data necessary for obtaining a tomographic image. In particular, it is preferably used for acquiring information regarding a tomographic image of eye fundus, tooth, and blood vessel of a human body, which are measurement objects.

According to the present disclosure, a surface emitting laser with wide wavelength-tunable band can be obtained.
(Description of Another Aspect of the Present Disclosure)

Figure 7A:
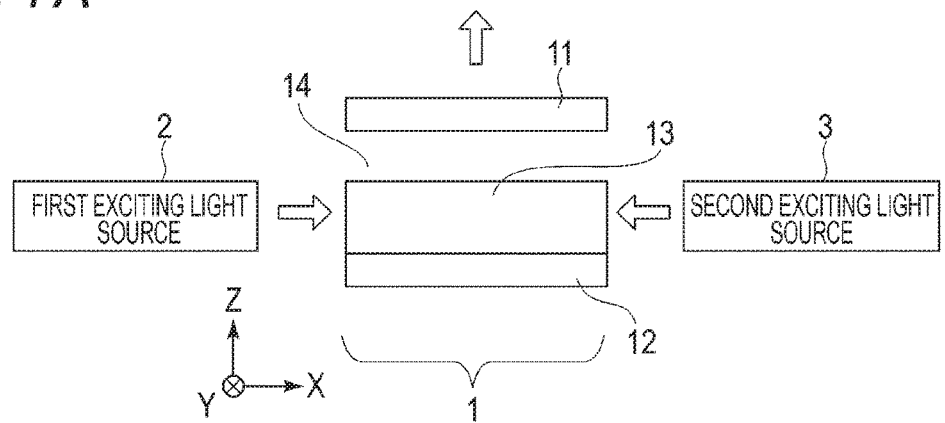
FIGS. 7A, 7B, and 7C illustrate an outline of a laser device according to another aspect of the present disclosure.
Figure 7B:
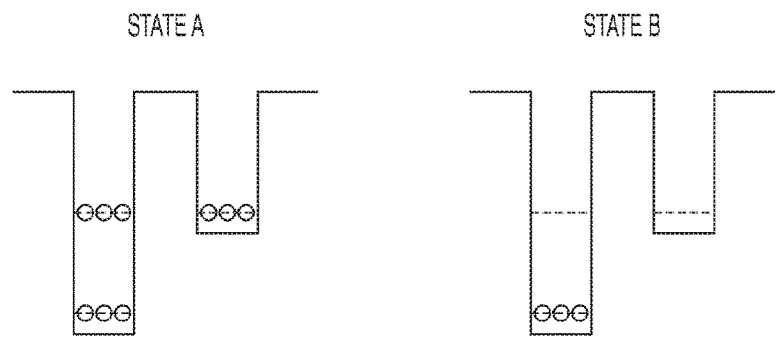
Figure 7C:
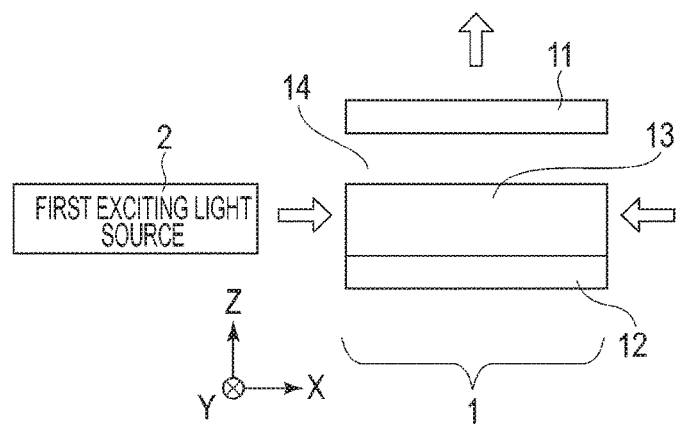

A laser device and an imaging system according to another aspect of the present disclosure will be described below. FIG. 7A to 7C are schematic views illustrating an outline of a laser device according to another aspect of the present disclosure.

A laser device according to another aspect of the present disclosure includes a wavelength-tunable type surface emitting laser 1, and a first exciting light source 2 and a second exciting light source 3 for exciting the surface emitting laser 1. The surface emitting laser 1 emits light with oscillation wavelength $\lambda_1$ and light with oscillation wavelength $\lambda_2$ longer than the oscillation wavelength $\lambda_1$. In addition, while the first exciting light source 2 emits light with peak wavelength $\lambda_3$, the second exciting light source 3 emits light with peak wavelength $\lambda_4$ longer than the peak wavelength $\lambda_3$. That is, the first exciting light source 2 and the second exciting light source 3 emit light with different peak wavelength.

An MEMS-VCSEL described above can be used as the surface emitting laser 1. Specifically, the surface emitting laser 1 includes a pair of reflector including a first reflectors 11 and a second reflector 12 and an active layer 13 provided between the pair of reflectors. Then, the surface emitting laser 1 emits light in the direction where the pair of reflectors and the active layer 13 are stacked (Z-direction in FIG. 7A). In addition, the first reflector 11 is a moving mirror, and it is possible to vary cavity length of a resonator including the pair of reflectors and vary oscillation wavelength of the surface emitting laser 1 by moving the moving mirror. A known method such as electrostatic force and thermal expansion can be used for driving the moving mirror, for example. Moreover, a space 14 is provided between the moving mirror and the active layer of the surface emitting laser 1 to drive the moving mirror. Note that, a spacer layer for adjusting cavity length may be provided between the active layer 13 and the second reflector 12 and between active layer 13 and the space 14 of the surface emitting laser 1.

In addition, the active layer of the surface emitting laser 1 may include a single quantum well layer or a multi-quantum well layer. Moreover, it is more preferable that the active layer include an asymmetric multi-quantum well layer to widen wavelength tunable width.

The asymmetric multi-quantum well layer refers to a layer with a plurality of well layers for forming a multi-quantum well layer in which at least one of the width of the well layer, the depth of the well layer, and the amount of distortion of the well layer against the substrate of at least one well layer is different from that of the remaining well layers. Alternatively, the asymmetric multi-quantum well layer refers to a layer with a plurality of barrier layers for forming a multi-quantum well layer in which at least one of the width of the barrier layer, the height of the barrier layer, and the amount of distortion of the barrier layer against the substrate of at least one barrier layer is different from the remaining barrier layers. In order to change the width of the well layer or the width of the barrier layer, it is only required to change the thickness of the well layer or the thickness of the barrier layer. In addition, the depth of the well layer and the height of the barrier layer is determined by a difference of conduction band energy or valence electron band energy between the barrier layer and the well layer. Therefore, in order to change the depth of the well layer or the height of the barrier layer, it is only required to change a material or composition used for the well layer or the barrier layer. If a material or composition used for the well layer or the barrier layer is changed, the amount of distortion of the well layer or the barrier layer can also be changed.

The first exciting light source 2 and the second exciting light source 3 may have any structure in so far as the surface emitting laser 1 can be excited. For example, light emitting diode, super luminescence diode (hereinafter referred to as "SLD"), edge emitting laser, or surface emitting laser can be used for the first exciting light source 2 and the second exciting light source 3.

An effect of another aspect of the present disclosure will be described below. In another aspect of the present disclosure, the first exciting light source 2 excites the active layer of the surface emitting laser 1 when the surface emitting laser 1 emits light with oscillation wavelength $\lambda_1$. Then, the second exciting light source 3 excites the active layer of the surface emitting laser 1 when the surface emitting laser 1 emits light with oscillation wavelength $\lambda_2$ longer than the oscillation wavelength $\lambda_1$. Since the peak wavelength $\lambda_3$ is shorter than the peak wavelength $\lambda_4$, excitation energy is large. Therefore, the amount of generation of carriers that are electrons and holes is larger since the active layer is excited more when light with peak wavelength $\lambda_3$ is emitted than when light with peak wavelength $\lambda_4$ is emitted.

FIG. 7B illustrates a carrier occupation state of each energy level of the quantum well layer when the active layer 13 is made of two quantum well layers with well layers with different depth. A case in which the active layer 13 includes two quantum well layers with well layers with different depth will be described below. The state A in FIG. 7B shows a carrier occupation state of an energy level of each well layer of the active layer 13 when the surface emitting laser 1 emits light with oscillation wavelength $\lambda_1$. As illustrated in FIG. 7B, in the state A, since excited energy is large and the number of generated carriers is large, carriers (electrons) can occupy up to a higher-order level of each quantum well layer. Therefore, in the state A, it is easy to oscillate with short wavelength due to higher-order level. In other words, in the state A, it is possible to say that an optical gain factor is large with short wavelength in the active layer 13. Note that, the wavelength $\lambda_3$ is only required to be shorter than the wavelength corresponding to energy exciting a higher-order energy level of the quantum well layer forming the active layer 13.

On the other hand, the state B in FIG. 7B is a carrier occupation state of an energy level of each well layer of the active layer 13 when the surface emitting laser 1 emits light with oscillation wavelength $\lambda_2$. In the state B, since excited energy is smaller than the state A and the number of generated carriers is small, carriers (electrons) can only occupy up to a ground level (n=1) of the quantum well layer with deep well layer. Therefore, in the state B, it is easy to oscillate with long wavelength due to ground level. In other words, it is possible to say that an optical gain factor is large with large wavelength in the active layer 13 in the state B. In addition, the wavelength $\lambda_4$ is only required to be shorter than the wavelength corresponding to energy exciting a ground energy level of the quantum well layer forming the active layer 13.

That is, in the states A and B, density of states of the well layer in the active layer 13 in which the surface emitting laser 1 can oscillate in different modes is formed. When cavity length of the resonator including the pair of reflectors is made short by moving the moving mirror in order to oscillate with the wavelength $\lambda_1$ in the surface emitting laser 1, an optical gain factor in the short wavelength band becomes higher by the first exciting light source 2 and it becomes easily oscillated with short wavelength. In addition, when cavity length is to be made longer in order to oscillate with the wavelength $\lambda_2$ in the surface emitting laser 1, an optical gain factor in the long wavelength band becomes higher by the second exciting light source 3 and it becomes easily oscillated with long wavelength.

In a known photo excitation type wavelength variable surface emitting laser, excitation is made by an exciting light source with single wavelength. Therefore, strong excitation for obtaining large output from a photoexcitation surface emitting laser makes an optical gain factor of the short wavelength side due to higher-order level of the active layer higher. Therefore, it becomes difficult to increase an optical gain factor of the long wavelength side and it has been difficult to obtain oscillation of the long wavelength side.

According to another aspect of the present disclosure, since it is possible to selectively increase an optical gain factor from short wavelength to long wavelength by selecting an exciting light source in accordance with wavelength sweeping of the surface emitting laser 1, it is possible to obtain oscillation of the long wavelength with higher output as compared with a traditional way. As a result, it is possible to widen the wavelength-tunable band with high output.

Note that, although an example in which the active layer 13 includes an asymmetric multi-quantum well layer has been described with reference to FIG. 7B, the present disclosure is not limited thereto. Since carriers (electrons) occupy up to a higher-order level in the state A even if the active layer 13 is a single quantum well layer or a symmetric quantum well layer, short wavelength is easily oscillated. Then, since carriers only occupy up to a ground level (n=1) or a lower level in the state B, long wavelength is easily oscillated. As described, a carrier occupation state of an energy level of the well layer in the active layer 13 in which the surface emitting laser 1 can oscillate with different modes is dynamically changed, and an effect according to another aspect of the present disclosure is obtained.

In addition, although FIG. 7A illustrates a structure in which the first exciting light source 2 and the second exciting light source 3 irradiate different areas of the surface emitting laser 1 with excitation light, they may irradiate the same area with light. In addition, the irradiation direction of excitation light to the surface emitting laser 1 is not limited as long as the surface emitting laser 1 is excited. Excitation light may be emitted from the direction parallel to the XY in-plane direction as illustrated in FIG. 7A or excitation light may be emitted from the Z direction or the direction oblique to the Z direction and the XY in-plane direction.

Note that, the exciting light source may only include the first exciting light source 2 as illustrated in FIG. 7C. The first exciting light source 2 may excite the active layer 13 of the surface emitting laser 1 by emitting light with the peak wavelength $\lambda_3$ when the surface emitting laser 1 emits light with the oscillation wavelength $\lambda_1$, and by emitting light with the peak wavelength $\lambda_4$ when the surface emitting laser 1 emits light with the oscillation wavelength $\lambda_2$. That is, an effect of another aspect of the present disclosure can be obtained even if one second exciting light source 2 is a wavelength variable light source that dynamically varies peak wavelength of emitted light in accordance with oscillation wavelength of the surface emitting laser 1.

In addition, a method for temporally changing a carrier occupation state of an energy level in the active layer 13 in accordance with wavelength sweeping of the surface emitting laser 1 includes a method for temporally changing the amount of current injected to the active layer 13 of the surface emitting laser 1 as described later.

(Active Layer)

A material of the active layer is not particularly limited as long as it emits light. If light with a wavelength band range near 850 nm is to be emitted, a material with a quantum well structure made from $Al_nGa_{1-n}As$ (0≤n≤1) can be used. In addition, if light with a wavelength band range near 1060 nm is to be emitted, a material made from $In_nGa_{1-n}As$ (0≤n≤1) can be used.

In addition, it is preferable that the active layer have sufficiently wide gain, in particular, it is preferable that the active layer have gain in a wavelength area wider than the reflex band of the first reflector and the second reflector. An example of such an active layer includes active layer with an asymmetric quantum well structure as described above. A material and structure of the active layer according to the present embodiment can be appropriately selected according to wavelength to be oscillated.

(First Reflector and Second Reflector)

The first reflector and the second reflector are distributed Bragg reflectors (hereinafter referred to as "DBR") in which layers with high refractive index and layers with low refractive index are alternately stacked with the optical thickness ¼ wavelength, for example. It is preferable that the reflector have as high reflectivity as possible in a broad band region in order to widen a wavelength variable range. Both a DBR of a semiconductor and a DBR of a dielectric material can be used for the first reflector and the second reflector. Generally, a DBR of a dielectric material can realize high reflectivity with small number of stacked layers since it can increase refractive index difference between layers with high refractive index and layers with low refractive index as compared with a DBR of a semiconductor. On the other hand, while the number of pairs is large, a DBR of a semiconductor has advantages in process that films can be simultaneously formed during crystal growth and current can be caused to flow by doping.

Although a semiconductor DBR can be used for both the second reflector and the first reflector for simultaneous forming by epitaxial growth, a dielectric material DBR may be used for the first reflector in order to obtain high reflectivity in a broader band region. Note that, when a dielectric material DBR is used for the first reflector, a dielectric material DBR can be formed over a semiconductor layer. As an example of a material of the first reflector, $Al_{0.4}Ga_{0.6}As$ and $Al_{0.9}Ga_{0.1}As$ can be used as a semiconductor DBR and silicon oxide and titanium oxide can be used as a dielectric material DBR. GaAs and AlAs can be used as the second reflector.

In addition, high index contrast subwavelength grating (hereinafter referred to as "HCG") may be used as the reflector. An HCG has a structure in which a material with high refractive index and a material with low refractive index are alternately and regularly provided in the in-plane direction. An example of HCG includes a periodic structure of high refractive index areas (AlGaAs areas) and low refractive index areas (gaps) with regular spaces by processing a semiconductor layer such as AlGaAs layer. In light of high-speed wavelength variation, the first reflector, which is a moving mirror, is required to be a light reflector, and an HCG is preferably used. Ones disclosed in the U.S. Pat. No. 8,059,690 and the U.S. Pat. No. 8,189,643 can be used as an HCG.

(Space)

Normally, solid does not exist in a space. Therefore, depending on its atmosphere, a space may be vacuum, or air, inert gas, or fluid such as water may exist. Note that, the length of the structure of a space in the thickness direction can be determined in consideration of wavelength tunable width or pull-in of the moving mirror. For example, if wavelength is to be varied with the wavelength tunable width of 100 nm with the center being 1060 nm with air in the space, the length of the space is about 2 μm.

An embodiment according to another aspect of the present disclosure will be described below. Note that, in this specification, the substrate side of the surface emitting laser is referred to as lower side and the side opposite to the substrate is referred to as upper side.

Sixth Embodiment

Figure 8A:
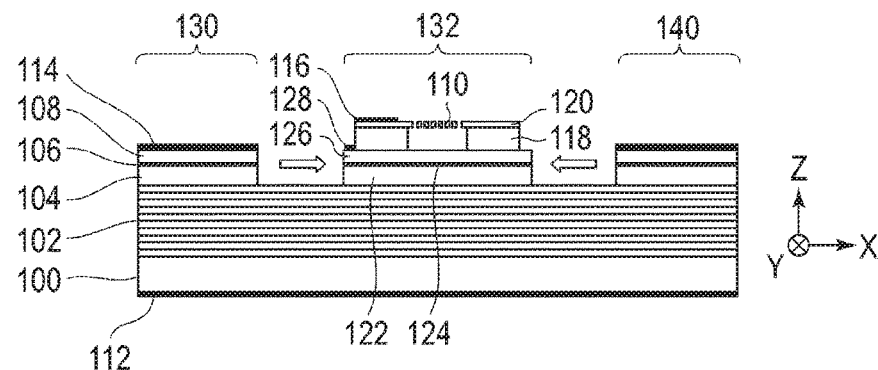
FIGS. 8A, 8B, and 8C are schematic views illustrating an example of a laser device according to a sixth embodiment of another aspect of the present disclosure.
Figure 8B:
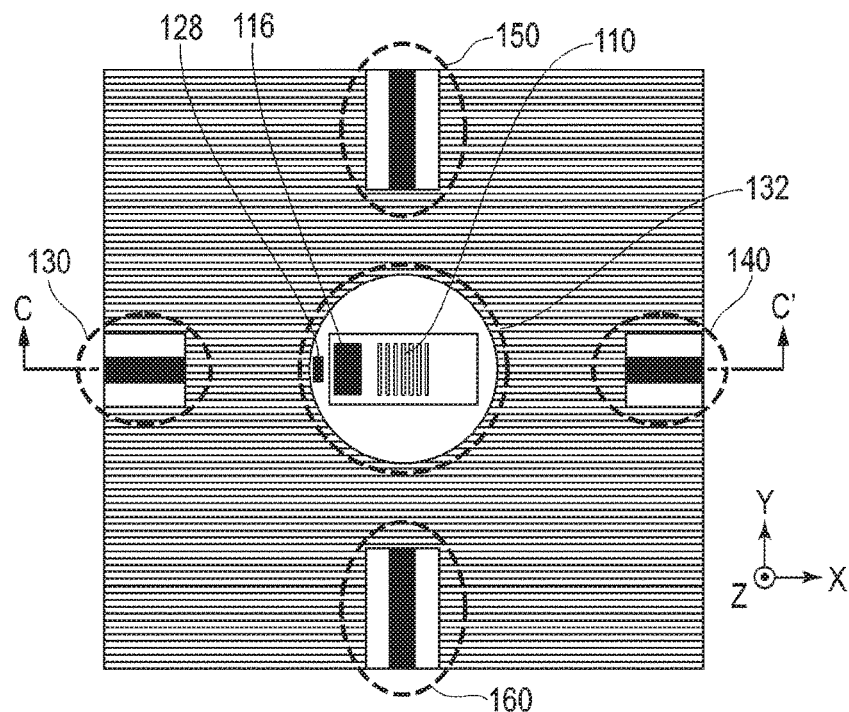
Figure 8C:
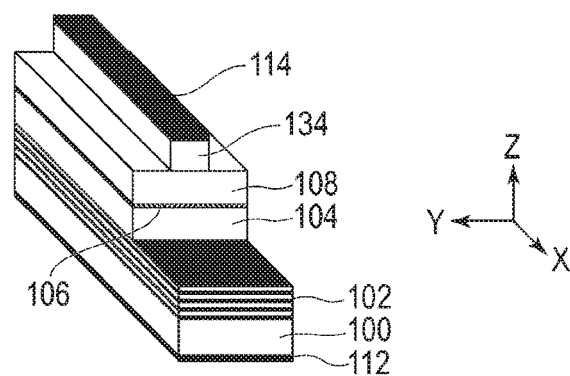

FIGS. 8A to 8C are schematic views illustrating an example of a laser device according to the present embodiment. FIG. 8A is a cross-sectional schematic view illustrating a laser device according to the present embodiment. FIG. 8B is an upper schematic view illustrating a laser device according to the present embodiment and FIG. 8A corresponds to the cross-section C-C' of FIG. 8B. As illustrated in FIGS. 8A and 8B, a laser device according to the present embodiment includes a surface emitting laser 132 and exciting light sources 130, 140, 150, and 160 for exciting the surface emitting laser 132. In the present embodiment, all of the exciting light sources 130, 140, 150, and 160 are edge emitting laser. The exciting light sources 130 and 140 emit light with peak wavelength $\lambda_3$ and the exciting light sources 150 and 160 emit light with the peak wavelength $\lambda_4$ different from the peak wavelength $\lambda_3$ of the exciting light sources 130 and 140. That is, the exciting light sources 130 and 140 correspond to the first exciting light source described above and the exciting light sources 150 and 160 correspond to the second exciting light source described above. Note that, although an example with four exciting light sources has been described in the present embodiment, it is only required to have at least two exciting light sources each of which emits light with different peak wavelength and to have two or more exciting light sources. In addition, although two types of light sources have been used, three or more types of exciting light sources that emit light with different peak wavelength may be used. Moreover, since the exciting light source is laser, the peak wavelength in the present embodiment corresponds to oscillation wavelength.

As illustrated in FIG. 8A, the surface emitting laser 132 includes a bottom reflector (corresponding to the second reflector) 102, a first lower spacer layer 122, an active layer 124, a first upper spacer layer 126, and an top reflector (corresponding to the first reflector) 110 in this order from the substrate 100 side. The top reflector 110 is supported by a beam 120 and the beam 120 is supported by a supporting layer 118 formed over the first upper spacer layer 126. A first electrode 116 is formed over the beam 120. A second electrode 128 is formed over the first upper spacer layer 126. The surface emitting laser 132 emits light in the direction where the pair of reflectors and the active layer 124 are stacked (Z-direction in FIG. 8A).

The beam 120 is made of a member with conductivity. Alternating current is injected between the first electrode 116 and the second electrode 128 to vibrate the beam 120 in the thickness direction (Z-direction) of the active layer 124. As a result, the top reflector 110 also vibrates in the thickness direction of the active layer 124, cavity length of a pair of reflectors including the top reflector 110 and the bottom reflector 102 is varied, and light with specific wavelength in accordance with the cavity length out of the light emitted from the active layer 124 is emitted to the outside. Accordingly, the oscillation wavelength of the surface emitting laser can be varied.

Note that, the active layer 124 is excited by an exciting light source described later to emit light.

The exciting light source 130 (140) includes a second lower spacer layer 104, an active layer 106, and a second upper spacer layer 108 in this order from the substrate 100 side. Exciting light sources 150 and 160 of FIG. 8B that are not illustrated in FIG. 8A have the same structure. The exciting light sources 130, 140, 150, and 160 are formed on the same substrate 100 as the surface emitting laser 132. In addition, each of the second lower spacer layer 104, the active layer 106, and the second upper spacer layer 108 of the exciting light source 130 (140, 150, and 160) may be made from the same material as the first lower spacer layer 122, the active layer 124, and the first upper spacer layer 126 of the surface emitting laser, respectively. In that case, regrowth is not necessary and it is possible to form the surface emitting laser 132 and each layer serving as the exciting light source 130 (140, 150, and 160) by the same process. Note that, the second lower spacer layer 104, the active layer 106, and the second upper spacer layer 108 of the exciting light source 130 (140, 150, and 160) may be made from a material different from that of the first lower spacer layer 122, the active layer 124, and the first upper spacer layer 126 of the surface emitting laser, respectively. In addition, the surface emitting laser 132 and the exciting light source 130 (140, 150, and 160) may not be formed on the same substrate 100.

In addition, a third electrode 114 is formed over the second upper spacer layer 108. Note that, the uppermost part of the second upper spacer layer 108 is a contact layer. In addition, a fourth electrode 112 is formed under the substrate 100. The active layer 106 emits light by injecting current between the third electrode 114 and the fourth electrode 112. Note that, although the fourth electrode 112 is formed to the area of the surface emitting laser 132, the fourth electrode 112 and the second electrode 128 is set (grounded) to the same potential. Therefore, since current is not injected between the fourth electrode 112 and the second electrode 128, current does not flow in the surface emitting laser 132.

The exciting light source 130 (140, 150, and 160) emits light in the direction that intersects with the direction in which the third electrode 114, the fourth electrode 112, and the active layer 124 are stacked (XY in-plane direction of FIG. 8A).

In addition, FIG. 8C is a perspective schematic view illustrating the exciting light source 130 (140, 150, and 160). The exciting light source 130 (140, 150, and 160) can serve as a light waveguide called a ridge 134, and is formed over the second upper spacer layer 108. Moreover, the third electrode 114 is formed over the ridge 134.

As illustrated in FIG. 8B, the cavity length of the exciting light sources 130 and 140 is different from that of the exciting light sources 150 and 160. That is, the length in the Y-direction, which is the oscillation direction of the exciting light sources 150 and 160 is longer than the length in the X-direction, which is the oscillation direction of the exciting light sources 130 and 140. With this structure, the oscillation wavelength of the exciting light sources 130 and 140 can be different from that of the exciting light sources 150 and 160. Specifically, the peak wavelength (oscillation wavelength) $\lambda_4$ of the exciting light sources 150 and 160 is longer than the peak wavelength (oscillation wavelength) $\lambda_3$ of the exciting light sources 130 and 140.

In the present embodiment, when the surface emitting laser 132 emits light with the oscillation wavelength $\lambda_1$, the active layer 124 of the surface emitting laser 132 is excited by the exciting light sources 130 and 140. Then, when the surface emitting laser 132 emits light with the oscillation wavelength $\lambda_2$ longer than the oscillation wavelength $\lambda_1$, the active layer 124 of the surface emitting laser 132 is excited by the exciting light sources 150 and 160. Specifically, when the surface emitting laser 132 oscillates wavelength in a wavelength band range shorter than the specific wavelength $\lambda_A$ out of the wavelength band range the surface emitting laser 132 oscillates, the exciting light sources 130 and 140 emit light and the exciting light sources 150 and 160 do not emit light. Then, when the surface emitting laser 132 oscillates wavelength of a wavelength band range more than the wavelength $\lambda_A$, the exciting light sources 130 and 140 do not emit light and the exciting light sources 150 and 160 emit light. Light emission and non-light emission of each exciting light source can be switched by injecting current more than lasing threshold of each exciting light source. In addition, the timing of switching between light emission and non-light emission of each exciting light source may be synchronized with driving of the moving mirror. For example, light emission and non-light emission of each exciting light source may be switched in accordance with the position of the moving mirror from the active layer 124 or a signal corresponding thereto (for example, voltage applied to the moving mirror).

By dynamically controlling light emission and non-light emission of a plurality of exciting light sources with different peak wavelength, it is possible to dynamically vary lasing threshold and widen the wavelength tunable width as described above.

Note that, the exciting light sources 130 and 140 are provided to face each other with the surface emitting laser 132 provided between the exciting light sources 130 and 140, and the exciting light sources 150 and 160 are provided to face each other with the surface emitting laser 132 provided between the exciting light sources 150 and 160. As described, when two exciting light sources that emit light with the same peak wavelength are provided, it is preferable that these two exciting light sources be provided to face each other with the surface emitting laser 132 provided between these two exciting light sources.

The surface emitting laser 132 and the exciting light sources 130, 140, 150, and 160 can be formed by a known epitaxial growth method, sacrificial layer etching method, photolithography method, or the like. In addition, by applying high-reflectivity coating to the surface opposite to the light emitting surface of the exciting light sources 130, 140, 150, and 160, it is possible to cause the light output surface to efficiently emit laser beam.

(Beam)

The beam may be supported by two support areas or may be supported by three or more support areas. In addition, the beam may be supported at one location such as silicon cantilever. Moreover, a component for relieving stress and the like attribute to distortion in crystal growth or operation environment temperature may be formed to the beam.

The beam is not particularly limited as long as it can vary cavity length. For example, a method for driving the beam includes a method for driving the beam by an electrostatic force as in the present embodiment, a method for mechanically driving the beam with a piezoelectric material, and a method for driving the beam with expansion and contraction due to heat.

In addition, the beam may also serve as a top reflector as in the present embodiment, or may be a separate component from a top reflector. In the latter case, it is only required to provide a top reflector at a position corresponding to the light-emitting section area of the beam, that is, a position corresponding to the light-emitting area, and the top reflector may be provided over or under the beam. In addition, it is also possible to employ a structure in which a through hole is provided at a position corresponding to the light-emitting area of the beam, and the top reflector is provided in the through hole.

(First Electrode, Second Electrode, Third Electrode, and Fourth Electrode)

The first electrode, the second electrode, the third electrode, and the fourth electrode can be made from single metal such as titanium and gold, alloy, or stacked body of metal films. For example, Ti/Au and AuGe/Ni/Au can be used as an electrode material. The second electrode can be provided at any position as long as it is over the first upper spacer layer.

(First Upper Spacer Layer, First Lower Spacer Layer, Second Upper Spacer Layer, and Second Lower Spacer Layer)

The first upper spacer layer and the second upper spacer layer may be made from the same semiconductor material or may be made from different semiconductor materials. Similarly, the first lower spacer layer and the second lower spacer layer may be made from the same semiconductor material or may be made from different semiconductor materials. GaAs, AlGaAs, and the like can be used as a semiconductor material.

In addition, the second upper spacer layer and the second lower spacer layer have conductivity. For example, if they are p-type, appropriate amount of acceptor such as Mg is doped. On the other hand, if they are n-type, appropriate amount of donor such as Si is doped. Note that, acceptor and donor may be doped to the first upper spacer layer and the first lower spacer layer. These spacer layers may be formed of monolayer or may include a plurality of layers.

(Active Layer of Exciting Light Source)

The active layer of the exciting light source may be made from the same semiconductor material as that of the active layer of the surface emitting laser, or may be made from a different semiconductor material. In addition, the active layer of the exciting light source may include an asymmetric multi-quantum well layer or may include single quantum well layer or a symmetric multi-quantum well layer. Moreover, the material, the thickness, or the like of the active layer may be appropriately changed in accordance with peak wavelength of light emitted from the exciting light source or they may be the same. GaAs, AlGaAs, and the like can be used as a semiconductor material.

Seventh Embodiment

Figure 9A:
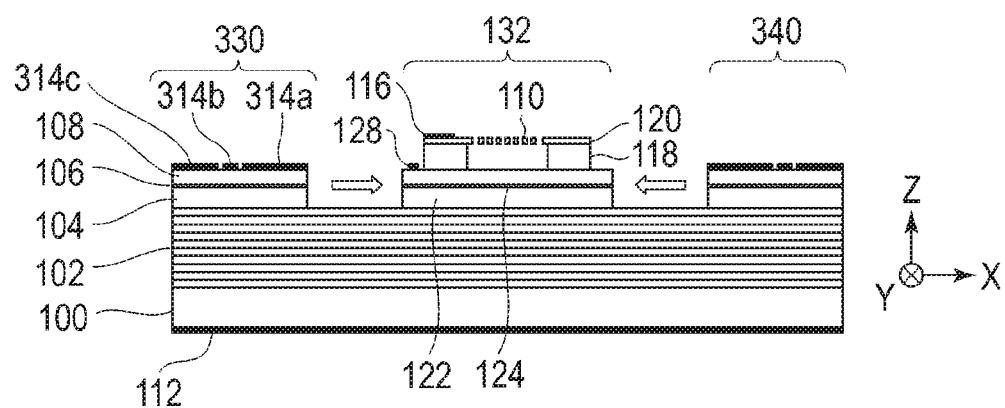
FIGS. 9A and 9B are schematic views illustrating an example of a laser device according to a seventh embodiment of another aspect of the present disclosure.
Figure 9B:
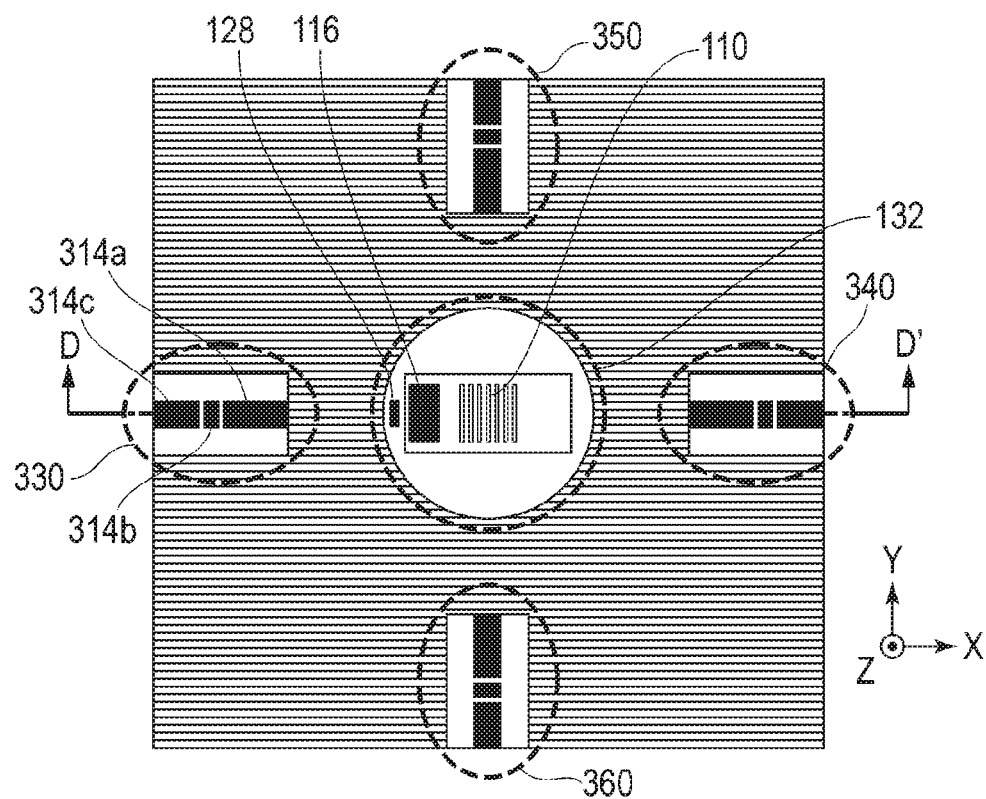

FIGS. 9A and 9B are schematic views illustrating an example of a laser device according to the present embodiment. FIG. 9A is a cross-sectional schematic view illustrating a laser device according to the present embodiment. FIG. 9B is an upper schematic view illustrating a laser device according to the present embodiment, and FIG. 9A corresponds to the cross-section D-D' in FIG. 9B. As illustrated in FIGS. 9A and 9B, a laser device according to the present embodiment includes the surface emitting laser 132 and exciting light sources 330, 340, 350, and 360 for exciting the surface emitting laser 132. While the exciting light sources 130, 140, 150, and 160 are edge emitting laser in the sixth embodiment, the exciting light sources 330, 340, 350, and 360 are SLD in the present embodiment. Other structures are the same as that of the sixth embodiment.

The exciting light sources 330 and 340 emit light with peak wavelength $\lambda_3$, and the exciting light sources 350 and 360 emit light with peak wavelength $\lambda_4$ that is different from the peak wavelength $\lambda_3$ of the exciting light sources 330 and 340. That is, the exciting light sources 330 and 340 correspond to the first exciting light source described above, and the exciting light sources 350 and 360 correspond to the second exciting light source described above.

The structure of the exciting light sources 330, 340, 350, and 360 is the same. The first electrode of each of the exciting light sources 330, 340, 350, and 360 is split into a first split electrode 314a, a second split electrode 314b, and a third split electrode 314c. It is possible to adjust spectrum and peak wavelength of the exciting light sources 330, 340, 350, and 360 by adjusting current injection density of the first split electrode 314a, the second split electrode 314b, and the third split electrode 314c. For example, it is possible to shorten the peak wavelength by making current injection density injected from the first split electrode 314a larger than current injection density injected to the second split electrode 314b and the third split electrode 314c. In addition, it is possible to increase peak wavelength by making current injection density injected to the third split electrode 314c larger than current injection density injected to the first split electrode 314a and the second split electrode 314b. As described, the exciting light sources 330 and 340 emit light with peak wavelength $\lambda_3$ and the exciting light sources 350 and 360 emit light with peak wavelength $\lambda_4$ by adjusting current injection density of the first split electrode 314a, the second split electrode 314b, and the third split electrode 314c. In addition, with such an adjustment of current injection density, it is possible to adjust not only peak wavelength but also spectrum. Note that, one disclosed in Japanese Patent Laid-Open No. 2014-082485 can be used as an SLD including a plurality of split electrodes.

Moreover, it is preferable that the length of a ridge of the SLD accommodate to peak wavelength in addition to adjustment of current injection density of the first split electrode 314a, the second split electrode 314b, and the third split electrode 314c. With this structure, it is possible to more effectively cause peak wavelength and spectrum of light emitted from the exciting light source to be a desired value.

Moreover, a plurality of exciting light sources may include both the edge emitting laser described in the sixth embodiment and the SLD in the present embodiment.

Eighth Embodiment

Figure 10:
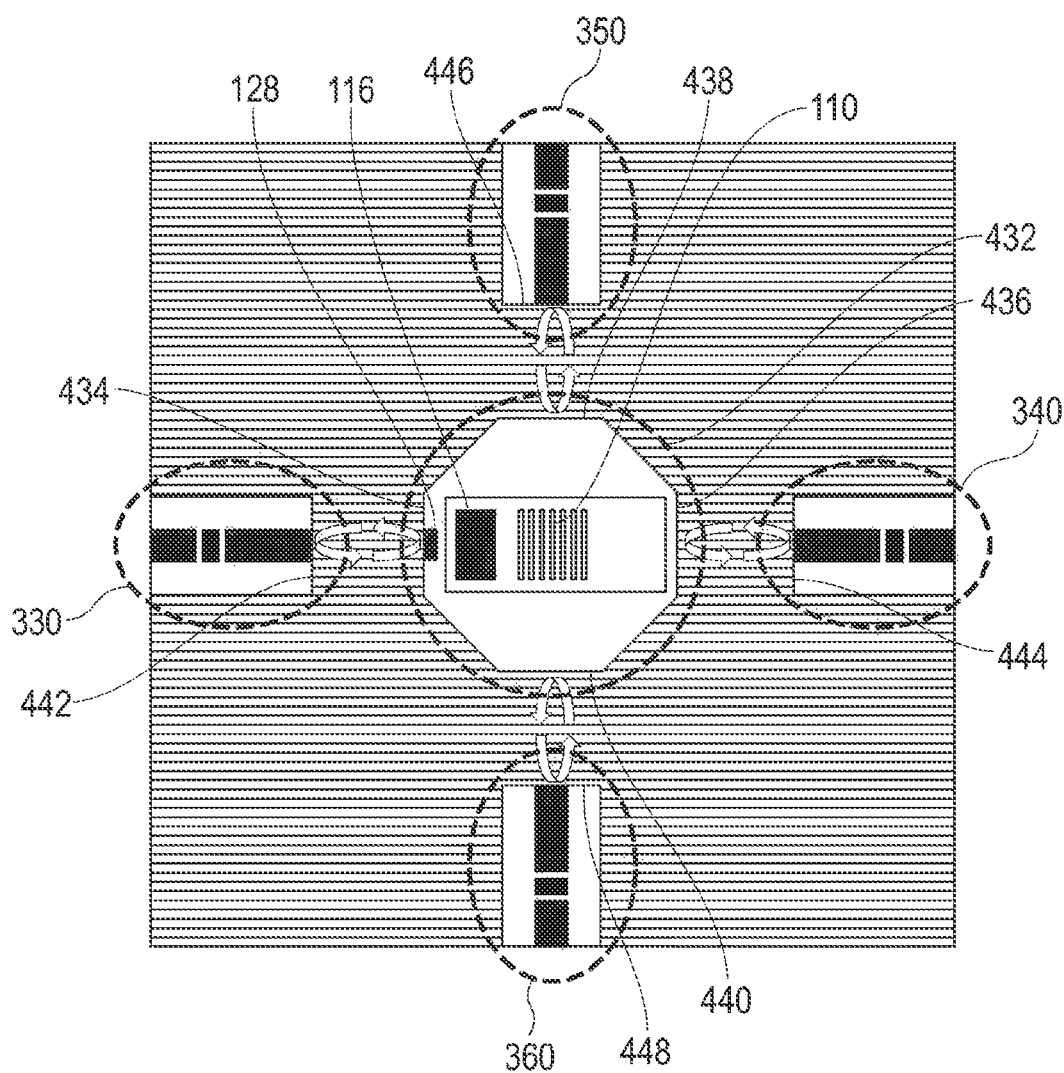
FIG. 10 is a schematic plan view illustrating an example of a laser device according to an eighth embodiment of another aspect of the present disclosure.

FIG. 10 is an upper schematic view illustrating an example of a laser device according to the present embodiment. As illustrated in FIG. 10, a laser device according to the present embodiment includes a surface emitting laser 432 and the exciting light sources 330, 340, 350, and 360 for exciting the surface emitting laser 432. The present embodiment is different from the seventh embodiment in that a resonator is formed between the light emitting surface of the exciting light sources 330, 340, 350, and 360 and the light incident surface of the surface emitting laser 432. Other structures are the same as the seventh embodiment. Note that, the exciting light sources 330, 340, 350, and 360 may be edge emitting laser as with the exciting light sources 130, 140, 150, and 160 of the sixth embodiment.

In the present embodiment, a light incident surface 434 where light emitted from the exciting light source 330 of the surface emitting laser 432 is incident is formed on a plane substantially parallel to a light emitting surface 442 of the exciting light source 330. Each of light incident surface 436, 438, and 440 of the surface emitting laser 432 is also formed on a plane substantially parallel to light emitting surface 444, 446, and 448, respectively, of the exciting light source 330. Moreover, the distance between the light emitting surface 442 of the exciting light source 330 and the light incident surface 434 and the distance between the light emitting surface 444 of the exciting light source 340 and the light incident surface 436 are the distance for being a resonator to resonate with the peak wavelength $\lambda_3$. Moreover, the distance between the light emitting surface 446 of the exciting light source 350 and the light incident surface 438 and the distance between the light emitting surface 448 of the exciting light source 360 and the light incident surface 440 are the distance for being a resonator to resonate with the peak wavelength $\lambda_4$. With such a structure, it is possible to strengthen peak wavelength of light emitted from the exciting light sources 330, 340, 350, and 360.

Ninth Embodiment

The present embodiment will be descried with reference to FIGS. 9A and 9B. In the seventh embodiment, the exciting light sources 330 and 340 emit light with the peak wavelength $\lambda_3$, and the exciting light sources 350 and 360 emit light with the peak wavelength $\lambda_4$ that is different from the peak wavelength $\lambda_3$ of the exciting light sources 330 and 340. In the present embodiment, the exciting light sources 330, 340, 350, and 360 emit light with the peak wavelength $\lambda_3$ and light with the peak wavelength $\lambda_4$ at different timings.

Specifically, if the surface emitting laser 132 emits light with the oscillation wavelength $\lambda_1$, the exciting light sources 330, 340, 350, and 360 emit light with the peak wavelength $\lambda_3$. Then, if the surface emitting laser 132 emits light with the oscillation wavelength $\lambda_2$ longer than the oscillation wavelength $\lambda_1$, the exciting light sources 330, 340, 350, and 360 emit light with the peak wavelength $\lambda_4$. It becomes possible by dynamically adjusting current injection density of the first split electrode 314a, the second split electrode 314b, and the third split electrode 314c.

With such an SLD, it is possible to finely adjust not only the peak wavelength $\lambda_3$ and the peak wavelength $\lambda_4$ but also peak wavelength and spectrum of light emitted from the exciting light source in accordance with the oscillation wavelength of the surface emitting laser 132. Therefore, it is possible to more finely control lasing threshold of the surface emitting laser 132 in accordance with the oscillation wavelength of the surface emitting laser 132.

Tenth Embodiment

Figure 11A:
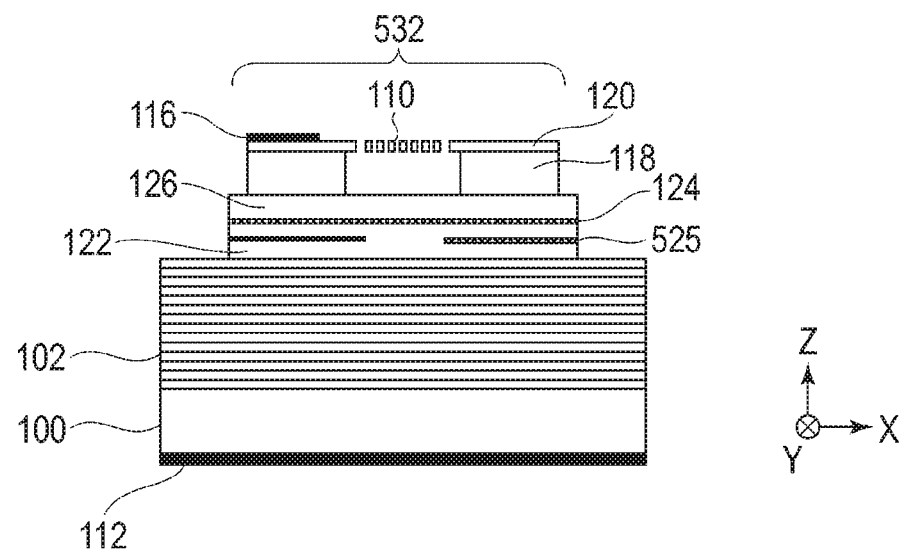
FIGS. 11A and 11B are schematic views illustrating an example of a laser device according to a tenth embodiment of another aspect of the present disclosure.
Figure 11B:
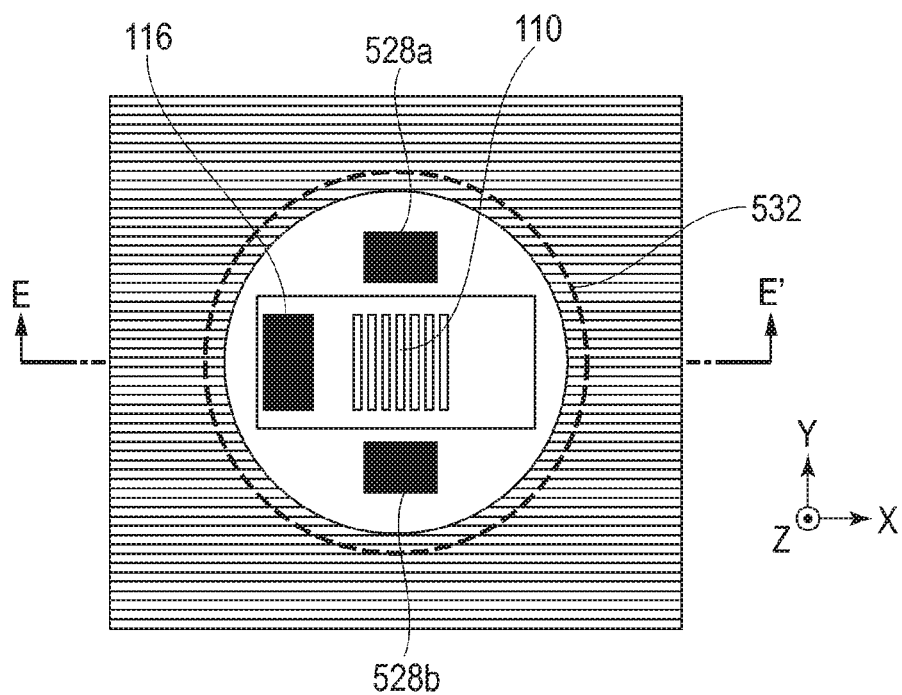

FIGS. 11A and 11B are schematic views illustrating an example of a laser device according to the present embodiment. FIG. 11A is a cross-sectional schematic view illustrating a laser device according to the present embodiment. FIG. 11B is an upper schematic view illustrating a laser device according to the present embodiment, and FIG. 11A corresponds to the cross-section E-E' in FIG. 11B.

While a structure in which an active layer of a surface emitting laser is excited by photoexcitation has been described in the sixth to ninth embodiments, a surface emitting laser 532 according to the present embodiment is current injection type. Specifically, as illustrated in FIG. 11B, in the surface emitting laser 532, fifth electrodes are formed over the first upper spacer layer 126 with the top reflector 110 provided between the fifth electrodes. The fifth electrodes are two split electrodes 528a and 528b. Each of the split electrodes 528a and 528b injects the same current. In addition, the potential of the split electrodes 528a and 528b is not the same as that of the fourth electrode 112, which is difference from the sixth to ninth embodiments. Therefore, when current is injected between the split electrodes 528a and 528b and the fourth electrode 112, electrons and holes are supplied to the active layer 124 and they are recombined, and the active layer 124 emits light.

In addition, in the present embodiment, current injection density injected from the split electrodes 528a and 528b to the first upper spacer layer 126 is changed in accordance with the wavelength oscillated by the surface emitting laser 532. Specifically, the current injection density when the surface emitting laser 532 emits light with the oscillation wavelength $\lambda_1$ is made larger than the current injection density when the surface emitting laser 532 emits light with the oscillation wavelength $\lambda_1$. Since the case with larger current injection density becomes the state A of FIG. 7B, an optical gain factor of short wavelength becomes large and short wavelength becomes easily oscillated. On the other hand, since the state B of FIG. 7B is obtained if current injection density is small, an optical gain factor of long wavelength becomes large and long wavelength becomes easily oscillated. Therefore, it is possible to change a carrier occupation state of an energy level of the active layer 124 in accordance with the wavelength of light emitted from the surface emitting laser 532. Note that, the surface emitting laser 532 includes a current confinement layer 525. This is to cause current to flow in the light-emitting area in the active layer 124 to improve light emission efficiency.

(Current Confinement Layer)

The current confinement layer includes an oxidized region selectively oxidized by a selectively oxidized process as a high-resistance part and a non-oxidized region not oxidized as a low-resistance part. In order to oxidize by a selectively oxidized process, an AlAs layer or an $Al_{0.99}Ga_{0.02}As$ layer with high Al composition ratio is preferably used, for example. $Al_xO_y$ is formed and a current confinement layer is formed by selectively oxidizing that layer in a high temperature water vapor atmosphere. Light-emitting shape can be controlled by controlling the shape of the non-oxidized region. The size of the non-oxidized region, that is, the light-emitting area, is about 5 μm to 15 μm.

It is only required to form the current confinement layer in the first upper spacer layer or the first lower spacer layer. In addition, there may be a plurality of current confinement layers. In that case, a plurality of current confinement layers may be formed over or under the active layer or may be formed both over and under the active layer.

Eleventh Embodiment

The present embodiment is about an information acquisition device with the laser device according to any one of Embodiments 6 to 10 used as a light source device. Since the components are the same as the fifth embodiment (FIG. 6) except the light source device, description will be omitted.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2015-215215, filed Oct. 30, 2015, and Japanese Patent Application No. 2015-225810, filed Nov. 18, 2015, which are hereby incorporated by reference herein in their entireties.

What is claimed is:

1. A laser device comprising:
a wavelength-tunable type surface emitting laser including an active layer; and
an excitation unit configured to excite the surface emitting laser, the excitation unit including at least a first exciting light source and a second exciting light source, the first exciting light source configured to emit light with peak wavelength $\lambda_1$, the second exciting light source configured to emit light with peak wavelength $\lambda_2$ different from the peak wavelength $\lambda_1$, the first exciting light source located laterally to, and spaced away from, the wavelength-tunable type surface emitting laser, the first exciting light source including a first electrode, a second electrode and an active layer provided between the first electrode and the second electrode, and the first exciting light source configured to emit light laterally to the wavelength-tunable type surface emitting laser in a perpendicular direction or an in-plane direction intersecting with a light output direction of the surface emitting laser, wherein
the excitation unit excites the active layer of the surface emitting laser so that a carrier occupation state of an energy level can oscillate different wavelength in different areas of the active layer of the surface emitting laser in an in-plane direction intersecting with a light output direction of the surface emitting laser,
the first exciting light source is provided so as to excite a first area of the active layer of the surface emitting laser by emitting light with the peak wavelength $\lambda_1$ for exciting the first area, and the second exciting light source is provided so as to excite a second area of the active layer of the surface emitting laser by emitting light with the peak wavelength $\lambda_2$ for exciting the second area, the different areas of the active layer of the surface emitting laser including the first area and the second area, and
at least the active layers of each of the surface emitting laser and the first exciting light source are located in different stacks that are spaced away from each other.

2. The laser device according to claim 1, wherein
the second exciting light source includes a first electrode, a second electrode, and an active layer provided between the first electrode and the second electrode of the second exciting light source,
the second exciting light source emits light in a direction perpendicular to a direction where the first electrode, the second electrode, and the active layer of the second exciting light source are stacked such that the second exciting light source is configured to emit light laterally to the wavelength-tunable type surface emitting laser in a perpendicular direction or an in-plane direction intersecting with a light output direction of the surface emitting laser, and
at least the active layer of the second exciting light source is located in a different stack, and is spaced away from, the respective stacks of at least the active layers of each of the first exciting light source and the surface emitting laser.

3. The laser device according to claim 2, wherein at least one of the active layer of the first exciting light source and the active layer of the second exciting light source includes an asymmetric multi-quantum well layer.

4. The laser device according to claim 2, wherein at least one of the active layer of the first exciting light source and the active layer of the second exciting light source is an active layer with the same structure as that of the active layer of the surface emitting laser.

5. The laser device according to claim 2, wherein the structure of the active layer of the first exciting light source is different from that of the active layer of the second exciting light source.

6. The laser device according to claim 2, wherein the structure of the active layer of the first exciting light source is the same as that of the active layer of the second exciting light source.

7. The laser device according to claim 2, wherein at least one of the first electrode of the first exciting light source and the first electrode of the second exciting light source includes a plurality of split electrodes.

8. The laser device according to claim 7, wherein
the first electrode of the first exciting light source includes a plurality of split electrodes, and
current injection density in each of the plurality of split electrodes of the first electrode of the first exciting light source is adjusted so that the first exciting light source emits light with the peak wavelength $\lambda_1$.

9. The laser device according to claim 7, wherein
the first electrode of the second exciting light source includes a plurality of split electrodes, and
current injection density in each of the plurality of split electrodes of the first electrode of the second exciting light source is adjusted so that the second exciting light source emits light with the peak wavelength $\lambda_2$.

10. The laser device according to claim 1, wherein a resonator configured to resonate light with the peak wavelength $\lambda_1$ is formed between a light emitting surface of the first exciting light source and a light incident surface of the surface emitting laser where light emitted from the first exciting light source is incident to the surface emitting laser.

11. The laser device according to claim 1, wherein a resonator configured to resonate light with the peak wavelength $\lambda_2$ is formed between a light emitting surface of the second exciting light source and a light incident surface of the surface emitting laser where light emitted from the second exciting light source is incident to the surface emitting laser.

12. The laser device according to claim 1, wherein the surface emitting laser includes a pair of reflectors and the active layer of the surface emitting laser is provided between the pair of reflectors, and light is emitted in a direction where the pair of reflectors and the active layer are stacked.

13. The laser device according to claim 1, wherein the active layer of the surface emitting laser includes an asymmetric multi-quantum well layer.

14. A laser device comprising:
a wavelength-tunable type surface emitting laser including an active layer;
a first exciting light source configured to excite the surface emitting laser and to emit light with peak wavelength $\lambda_1$; and a second exciting light source configured to excite the surface emitting laser and to emit light with peak wavelength $\lambda_2$ different from the peak wavelength $\lambda_1$, wherein the first exciting light source and the second exciting light source are provided so as to excite different areas of the active layer of the surface emitting laser in an in-plane direction intersecting with a light output direction of the surface emitting laser, the first exciting light source configured to excite a first area of the active layer of the surface emitting laser by emitting light with the peak wavelength $\lambda_1$ for exciting the first area, the second exciting light source configured to excite a second area of the active layer of the surface emitting laser by emitting light with the peak wavelength $\lambda_2$ for exciting the second area, the different areas of the active layer of the surface emitting laser including the first area and the second area, the first exciting light source and the second exciting light source are located laterally to, and spaced away from, the wavelength-tunable type surface emitting laser, the first exciting light source and the second exciting light source each including a first electrode, a second electrode and an active layer provided between the first electrode and the second electrode, and the first exciting light source and the second exciting light source each configured to emit light laterally to the wavelength-tunable type surface emitting laser in a perpendicular direction or an in-plane direction intersecting with a light output direction of the surface emitting laser, and at least the active layers of each of the first exciting light source, the second exciting light source and the surface emitting laser are located in different stacks that are spaced away from each other.

15. An information acquisition device comprising:

the laser device according to claim 1; and an information acquiring unit configured to acquire information inside a measurement object.

16. An imaging system comprising:

the laser device according to claim 1, an interfering optical system configured to split light from the surface emitting laser into light to emit to a measurement object and reference light and to generate interfering light by reflected light of the light emitted to the measurement object and the reference light; and a detecting unit configured to receive the interfering light.

17. The laser device according to claim 1, wherein the different stacks of each of the active layers of at least the first exciting light source and the surface emitting laser extend from a substrate.

18. The laser device according to claim 1, wherein the surface emitting laser further includes at least one reflector and at least two electrodes that operate to vibrate the at least one reflector in a thickness direction of the active layer of the surface emitting laser to vary a length of a cavity of the surface emitting laser, the cavity being located between the at least one reflector and the active layer of the surface emitting laser.

\* \* \* \* \*